(12) United States Patent
Jeon

(10) Patent No.: US 8,933,446 B2
(45) Date of Patent: Jan. 13, 2015

(54) HIGH ELECTRON MOBILITY TRANSISTORS AND METHODS OF MANUFACTURING THE SAME

(71) Applicant: Samsung Electronics Co., Ltd., Suwon-Si (KR)

(72) Inventor: Woo-chul Jeon, Daegu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/800,614

(22) Filed: Mar. 13, 2013

(65) Prior Publication Data

US 2014/0021480 A1     Jan. 23, 2014

(30) Foreign Application Priority Data

Jul. 19, 2012   (KR) .......................... 10-2012-0078956

(51) Int. Cl.

| | | |
|---|---|---|
| H01L 29/80 | (2006.01) | |
| H01L 29/66 | (2006.01) | |
| H01L 29/10 | (2006.01) | |
| H01L 29/778 | (2006.01) | |
| H01L 29/06 | (2006.01) | |
| H01L 29/40 | (2006.01) | |
| H01L 29/20 | (2006.01) | |
| H01L 29/423 | (2006.01) | |

(52) U.S. Cl.
CPC ............. *H01L 29/778* (2013.01); *H01L 29/402* (2013.01); *H01L 29/66431* (2013.01); *H01L 29/1066* (2013.01); *H01L 29/66462* (2013.01); *H01L 29/2003* (2013.01); *H01L 29/0649* (2013.01); *H01L 29/7787* (2013.01); *H01L 29/42316* (2013.01)
USPC ........................................... 257/43; 438/172

(58) Field of Classification Search
CPC .............. H01L 29/778; H01L 29/4236; H01L 29/66462
USPC .............................................. 257/43; 438/172
See application file for complete search history.

(56) References Cited

U.S. PATENT DOCUMENTS

| | | |
|---|---|---|
| 7,863,649 B2 | 1/2011 | Hikita et al. |
| 8,101,972 B2 | 1/2012 | Hikita et al. |
| 2009/0146182 A1 | 6/2009 | Hikita et al. |
| 2011/0037100 A1 | 2/2011 | Hikita et al. |
| 2011/0073912 A1 | 3/2011 | Marui et al. |
| 2011/0233538 A1* | 9/2011 | Iwakami et al. ................. 257/43 |

FOREIGN PATENT DOCUMENTS

| | | |
|---|---|---|
| JP | 2010-272728 A | 12/2010 |
| JP | 2011-066464 A | 3/2011 |
| JP | 2011-109131 A | 6/2011 |
| JP | 2011-129607 A | 6/2011 |
| JP | 2011-210781 A | 10/2011 |
| KR | 20070032390 | 3/2007 |
| KR | 10-1018239 B1 | 2/2011 |

* cited by examiner

*Primary Examiner* — Thomas L Dickey
(74) *Attorney, Agent, or Firm* — Harness, Dickey & Pierce, P.L.C.

(57) ABSTRACT

A HEMT according to example embodiments may include a first semiconductor layer, a second semiconductor layer configured to induce a 2-dimensional electron gas (2DEG) in the second semiconductor layer, an insulating mask layer on the second semiconductor layer, a depletion forming layer on one of a portion of the first semiconductor layer and a portion of the second semiconductor layer that is exposed by an opening defined by the insulating mask layer, a gate on the depletion forming layer, and a source and a drain on at least one of the first semiconductor layer and the second semiconductor layer. The source and drain may be spaced apart from the gate. The depleting forming layer may be configured to form a depletion region in the 2DEG.

38 Claims, 18 Drawing Sheets

< OFF STATE >

< ON STATE >

< OFF STATE >

< ON STATE >

HIGH ELECTRON MOBILITY TRANSISTORS AND METHODS OF MANUFACTURING THE SAME

CROSS-REFERENCE TO RELATED APPLICATION

This application claims priority under 35 U.S.C. §119 to Korean Patent Application No. 10-2012-0078956, filed on Jul. 19, 2012, in the Korean Intellectual Property Office, the disclosure of which is incorporated herein in its entirety by reference.

BACKGROUND

1. Field

The present disclosure relates to semiconductor devices and/or methods of manufacturing the same, in more particular, to high electron mobility transistors (HEMTs) and/or methods of manufacturing the HEMTs.

2. Description of the Related Art

Various power conversion systems include a device for controlling flow of an electric current through ON/OFF switching operations, that is, a power device. In a power conversion system, efficiency of the entire system may be depend upon efficiency of a power device.

Power devices that are currently commercialized are mostly power metal-oxide-semiconductor field-effect transistors (MOSFETs) or insulated gate bipolar transistors (IGBTs) which are based on silicon (Si). However, it is difficult to increase efficiency of the power device based on the silicon due to limitations in physical properties of the silicon and in manufacturing processes. Accordingly, research for increasing conversion efficiency by applying group III-V based compound semiconductor to a power device is being conducted. In this regard, high electron mobility transistors (HEMTs) using a heterojunction structure of compound semiconductors have drawn attention.

HEMTs may include semiconductors having different electric polarization characteristics. In a HEMTa HEMT, a semiconductor layer having relatively large polarizability may induce a 2-dimensional electron gas (2DEG) in another semiconductor layer adhered to the semiconductor layer. Electronic mobility in the 2DEG may be very high. However, in order to efficiently use a HEMTa HEMT in various electronic devices, it is desired to improve or adjust the characteristics of the HEMT. In particular, it is desired to improve or adjust an on-current level, a threshold voltage, and the like of the HEMT.

SUMMARY

Example embodiments relate to high electron mobility transistors (HEMTs) having excellent operating characteristics.

Example embodiments relate to HEMTs having a normally-off characteristic and a low channel resistance.

Example embodiments relate to HEMTs having a low ON-resistance.

Example embodiments relate to HEMTs of which threshold voltage may be easily adjusted.

Example embodiments relate to methods of manufacturing HEMTs.

Additional aspects will be set forth in part in the description which follows and, in part, will be apparent from the description, or may be learned by practice of example embodiments.

According to example embodiments, a high electron mobility transistor (HEMT) includes: a first semiconductor layer; a second semiconductor layer configured to induce a 2-dimensional electron gas (2DEG) in the first semiconductor layer; an insulating mask layer on the second semiconductor layer, the insulating mask layer defining an opening that exposes one of a portion of the first semiconductor layer and a portion of the second semiconductor layer; a depletion forming layer on the one of the portion of the first semiconductor layer and the portion of the second semiconductor layer that is exposed by the opening in the insulating mask layer; a gate on the depletion forming layer; and a source and a drain on at least one of the first semiconductor layer and the second semiconductor layer. The source and drain are spaced apart from the gate. The depletion forming layer is configured to form a depletion region in the 2DEG.

In example embodiments, a portion of the insulating mask layer may be between an end of the depletion forming layer and the second semiconductor layer, and an other portion of the insulating mask layer may be between an other end of the depletion forming layer and the second semiconductor layer.

In example embodiments, an upper surface of the second semiconductor layer may define a recess region. The opening in the insulating mask layer may expose one of an upper surface of the first semiconductor layer and at least a portion of the recess region, and the depletion forming layer may be in the recess region of the second semiconductor layer.

In example embodiments, the insulating mask layer may be on the upper surface of the second semiconductor layer except for the recess region, the opening in the insulating mask layer may expose an inner side surface of the recess region of the second semiconductor layer, and the opening in the insulating mask layer may further expose one of the upper surface of the first semiconductor layer and a bottom surface of the recess region of the second semiconductor layer.

In example embodiments, the insulating mask layer may be on the upper surface of the second semiconductor layer and an inner side surface of the recess region of the second semiconductor layer, and the opening in the insulating mask layer may expose one of a bottom surface of the recess region of the second semiconductor layer and the upper surface of the first semiconductor layer.

In example embodiments, the insulating mask layer may be on the upper surface of the second semiconductor layer, the insulating mask layer may be on an inner side surface of the recess region of the second semiconductor layer, and the insulating mask layer may be on one of a portion of a bottom surface of the recess region of the second semiconductor layer and the upper surface of the first semiconductor layer, and a remaining region of the one of the bottom surface of the recess region of the second semiconductor layer and the upper surface of the first semiconductor layer may be exposed by the opening in the insulating mask layer. The remaining region of the one of the bottom surface of the recess region of the second semiconductor layer and the upper surface of the first semiconductor layer may be one of: a center portion of the bottom surface of the recess region of the second semiconductor layer, a portion adjacent to the center portion of the bottom surface of the recess region of the second semiconductor layer, a center portion of the upper surface of the first semiconductor layer under the recess region of the second semiconductor layer, and a portion adjacent to the center portion of the upper surface of the first semiconductor layer under the recess region of the second semiconductor layer.

In example embodiments, the recess region of the second semiconductor layer may be formed to a depth that is shallower than an interface between the first semiconductor layer and the second semiconductor layer.

In example embodiments, the recess region may be formed to a depth level at which the 2DEG is maintained on the interface between the first semiconductor layer and the second semiconductor layer, and the 2DEG portion corresponding to the recess region of the second semiconductor layer may be depleted due to the depletion forming layer.

In example embodiments, a thickness of the second semiconductor layer under the recess region may be greater than or equal to about 5 nm.

In example embodiments, the recess region of the second semiconductor layer may be formed to an interface between the first semiconductor layer and the second semiconductor layer. A width of a bottom surface of the recess region of the second semiconductor layer may be less than or equal to about 0.5 μm.

In example embodiments, the first semiconductor layer may include a GaN-based material.

In example embodiments, the second semiconductor layer may have one of a single-layered structure and a multi-layered structure, and the second semiconductor layer may include at least one nitride containing at least one of aluminum (Al), gallium (Ga), indium (In), and boron (B).

In example embodiments, the depletion forming layer may include a p-type semiconductor.

In example embodiments, the depletion forming layer may include a region doped with p-type impurities.

In example embodiments, the depletion forming layer may include a group III-V based nitride semiconductor.

In example embodiments, the HEMT may further include a field plate extending from the gate over the insulating mask layer.

In example embodiments, the field plate may extend over the insulating mask layer between the gate and the drain.

In example embodiments, the HEMT may be configured as a normally-off device.

In example embodiments, the HEMT may be used as a power device.

According to example embodiments, a method of manufacturing a high electron mobility transistor (HEMT) includes: forming a first semiconductor layer; forming a second semiconductor layer that is configured to induce a 2-dimensional electron gas (2DEG) in the first semiconductor layer; forming an insulating mask layer on the second semiconductor layer, the insulating mask layer defining an opening that exposes one of a portion of the first semiconductor layer and a portion of the second semiconductor layer; forming a depletion forming layer on the one of the portion of the first semiconductor layer and the portion of the second semiconductor layer that is exposed by the opening in the insulating mask layer, the depletion forming layer being configured to form a depletion region in the 2DEG; forming a gate on the depletion forming layer; and forming a source and a drain on at least one of the first semiconductor layer and the second semiconductor layer. The source and drain are spaced apart from the gate.

In example embodiments, a portion of the insulating mask layer may be located between an end of the depletion forming layer and the second semiconductor layer, and an other portion of the insulating mask layer may be located between an other end of the depletion forming layer and the second semiconductor layer.

In example embodiments, the method may further include forming a recess region defined by an upper surface of the second semiconductor layer. One of an upper surface of the first semiconductor layer and at least a portion of the recess region of the second semiconductor layer may be exposed by the opening in the insulating mask layer, and the forming of the depletion layer may include forming the depletion layer in the recess region of the second semiconductor layer.

In example embodiments, forming the insulating mask layer may include forming the insulating mask layer on the upper surface of the second semiconductor layer except for the recess region so an inner side surface of the recess region of the second semiconductor layer may be exposed by the opening in the insulating mask layer, and the opening in the insulating mask layer may further expose one of the upper surface of the first semiconductor layer and the bottom surface of the recess region of the second semiconductor layer.

In example embodiments, forming the insulating mask layer may include forming the insulating mask layer on the upper surface of the second semiconductor layer, and forming the insulating mask layer on an inner side surface of the recess region of the second semiconductor layer so the opening in the insulating mask layer exposes one of the upper surface of the first semiconductor layer and a bottom surface of the recess region of the second semiconductor layer.

In example embodiments, forming the insulating mask layer may include forming the insulating mask layer on the upper surface of the second semiconductor layer, forming the insulating mask layer on an inner side surface of the of the recess region of the second semiconductor layer in the recess region, forming the insulating mask layer on one of the upper surface of the first semiconductor layer and a portion of a bottom surface of the recess region of the second semiconductor layer so a remaining region of the one of the upper surface of the first semiconductor layer and the bottom surface of the recess region of the second semiconductor layer may be exposed by the opening in the insulating mask layer. The remaining region of the one of the upper surface of the first semiconductor layer and the bottom surface of the recess region of the second semiconductor layer may be one of a center portion of the bottom surface of the recess region of the second semiconductor layer, a portion adjacent to the center portion of the bottom surface of the recess region of the second semiconductor layer, a center portion of the upper surface of the first semiconductor layer under the recess region of the second semiconductor layer, and a portion adjacent to the center portion of the upper surface of the first semiconductor layer under the recess region of the second semiconductor layer.

In example embodiments, forming the recess region may include forming the recess region to a depth that is shallower than an interface between the first semiconductor layer and the second semiconductor layer. The recess region may be formed to a depth level at which the 2DEG is maintained on the interface between the first semiconductor layer and the second semiconductor layer. The forming the depletion layer may include depleting the 2DEG portion corresponding to the recess region of the second semiconductor layer due to the depletion forming layer.

In example embodiments, forming the recess region may include forming the recess region to an interface between the first semiconductor layer and the second semiconductor layer.

In example embodiments, the first semiconductor layer may include a GaN-based material.

In example embodiments, the second semiconductor layer may have one of a single-layered structure and a multi-layered structure, and the second semiconductor layer may include at least nitride containing at least one of aluminum (Al), gallium (Ga), indium (In), and boron (B).

In example embodiments, the depletion forming layer may include a p-type semiconductor.

In example embodiments, the depletion forming layer may include a region doped with p-type impurities.

In example embodiments, the depletion forming layer may include a group III-V based nitride semiconductor.

In example embodiments, the method may further include forming a field plate extending from the gate over the insulating mask layer.

According to example embodiments, a high electron mobility transistor includes: a first semiconductor layer; a second semiconductor layer on the first semiconductor layer, the second semiconductor layer being configured to induce a 2-dimensional electron gas (2DEG) in the first semiconductor layer; a first electrode, a second electrode, and a third electrode spaced apart on at least one of the first semiconductor layer and the second semiconductor layer; a depletion forming layer configured to form a depletion region in the 2DEG, the depletion forming layer being between the second electrode and the second semiconductor layer; and an insulating mask layer defining an opening through which at least a portion of the depletion forming layer extends into.

In example embodiments, an upper surface of the second semiconductor layer defines a recess region, the opening in the insulating mask layer exposes one of a portion of the first semiconductor layer and a portion of the second semiconductor layer, and the depletion forming layer is in the recess region of the second semiconductor layer.

In example embodiments, the insulating mask layer covers at least one inner side surface of the second semiconductor layer in the recess region of the second semiconductor layer.

In example embodiments, the first semiconductor layer includes a group III-IV based compound semiconductor, and the second semiconductor layer includes a group III-V based compound semiconductor that has at least one of a different polarization characteristic, a different energy bandgap, and a different lattice constant compared to the first semiconductor layer.

In example embodiments, a field plate may extend form the second electrode over the insulating mask layer, and the field plate may be spaced apart from the first electrode and the third electrode.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating principles of inventive concepts. In the drawings.

DETAILED DESCRIPTION

Figure 1:
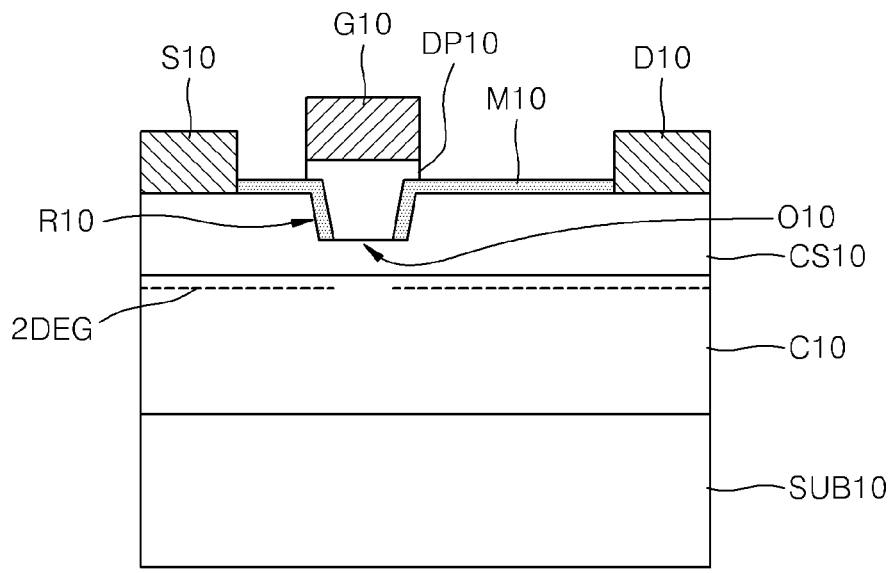
FIG. 1 is a cross-sectional view of a high electron mobility transistor (HEMT) according to example embodiments.

Hereinafter, high electron mobility transistors (HEMTs) and methods of manufacturing the same will be described in detail with reference to accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a HEMT according to example embodiments.

Referring to FIG. 1, a channel layer C10 may be disposed on a substrate SUB10. The substrate SUB10 may include, for example, sapphire, silicon (Si), silicon carbide (SiC), gallium nitride (GaN), direct-bonded copper (DBC), or the like. However, kinds of materials forming the substrate SUB10 are not limited thereto and may be modified variously. The channel layer C10 may be a semiconductor layer. The channel layer C10 may include a group III-V based compound semiconductor. For example, the channel layer C10 may include a GaN-based material (e.g., GaN). In this case, the channel layer C10 may be undoped GaN layer, but in some cases, may be a GaN layer doped with one or more impurities. Although not shown in FIG. 1, a buffer layer may be disposed between the substrate SUB10 and the channel layer C10. The buffer layer may reduce in lattice constant differences and thermal expansion coefficient differences between the substrate SUB10 and the channel layer C10. The buffer layer may reduce (and/or prevent) deterioration of crystallinity of the channel layer C10. The buffer layer may have a single-layered or multi-layered structure including at least one nitride containing at least one of aluminum (Al), gallium (Ga), indium (In), and boron (B). In more detail, the buffer layer may have a single-layered or multi-layered structure including at least one of AlN, GaN, AlGaN, InGaN, AlInN, and AlGaInN. In some cases, a seed layer (not shown) may be further disposed between the substrate SUB10 and the buffer layer. The seed layer may be a base layer for growing the buffer layer.

A channel supply layer CS10 may be disposed on the channel layer C10. The channel supply layer CS10 may be a semiconductor layer that is different from the channel layer C10. The channel supply layer CS10 may be a layer that induces a 2-dimensional electron gas (2DEG) in the channel layer C10. The 2DEG may be formed in a region of the channel layer C10 adjacent to an interface between the channel layer C10 and the channel supply layer CS10. The channel supply layer CS10 may include a material (semiconductor) having different polarization characteristic and/or energy bandgap and/or lattice constant from those of the channel layer C10. The channel supply layer CS10 may include a material (semiconductor) having higher polarizability and/or wider energy bandgap than those of the channel layer C10. For example, the channel supply layer CS10 may have a single-layered or multi-layered structure including at least one nitride containing at least one of Al, Ga, In, and B. In more detail, the channel supply layer CS10 may have a single-layered or multi-layered structure including at least one AlGaN, AlInN, InGaN, AlN, AlInGaN, and the like. The channel supply layer CS10 may be an undoped layer, or may be a layer doped with one or more impurities. For example, the channel supply layer CS10 may be doped with an n-type impurity such as silicon, but example embodiments are not limited thereto. A thickness of the channel supply layer CS10 may be several tens of nanometers (nm) or less. For example, the thickness of the channel supply layer CS10 may be about 50 nm or less.

A recess region R10 may be formed in the channel supply layer CS10. The recess region R10 may be formed by etching a portion of the channel supply layer CS10 to a desired (and/or alternatively predetermined) depth. The recess region R10 may be formed to a shallower depth than the interface between the channel layer C10 and the channel supply layer CS10. In this case, the recess region R10 may be formed to a depth level at which the 2DEG may be maintained at the interface between the channel layer C10 and the channel supply layer CS10. For example, a thickness of the channel supply layer CS10 under the recess region R10 may be about 5 nm or greater. The 2DEG region corresponding to the recess region R10 may be depleted by a depletion forming layer DP10 that will be described later.

An insulating mask layer M10 may be disposed on the channel supply layer CS10. The insulating mask layer M10 may be formed of at least one insulating material such as a silicon oxide, silicon oxynitride, or a silicon nitride, and may have a single-layered or multi-layered structure. At least a portion of the recess region R10 may not be covered by the insulating mask layer M10. Therefore, the insulating mask layer M10 may have an opening O10 that exposes at least a portion of the recess region R10. For example, most of a bottom surface of the recess region R10 (a region except for opposite ends of the bottom surface) may not be covered by the insulating mask M10. An inner side surface of the recess region R10 and an upper surface of the channel supply layer CS10 may be covered by the insulating mask layer M10.

The depletion forming layer DP10 may be formed on the bottom surface of the recess region R10, which is not covered by the insulating mask layer M10, that is, the channel supply layer CS10 exposed by the opening of the insulating layer M10. The depletion forming layer DP10 may be a layer that is epitaxially grown from the region of the channel supply layer CS10, which is not covered by the insulating mask layer M1, that is, the bottom surface of the recess region R10. Growth of the depletion forming layer DP10 from the channel supply layer CS10 covered by the insulating mask layer M10 may be reduced (and/or prevented). In this point of view, the insulating mask layer M10 may be referred to as a growth-preventing layer. When forming the depletion forming layer DP10, the inner side surface of the recess region R10 and the entire upper surface of the channel supply layer CS10 may be covered by the insulating mask layer M10 except for the bottom surface of the recess region R10. Therefore, the depletion forming layer DP10 may be selectively grown only from the bottom surface of the recess region R10. A portion of the insulating mask layer M10 may be located between an end of the depletion forming layer DP10 and the channel supply layer CS10, and the other portion of the insulating mask layer M10 may be located between the other end of the depletion forming layer DP10 and the channel supply layer CS10.

The depletion layer DP10 may form a depletion region in the 2DEG. An energy bandgap of the channel supply layer CS10 under the depletion forming layer DP10 may be increased due to the depletion forming layer DP10, and accordingly, a depletion region may be formed in the 2DEG of the channel layer C10 corresponding to the depletion forming layer DP10. Therefore, a portion of the 2DEG corresponding to the depletion forming layer DP10 may not exist or may have different characteristics (electron density, etc.) from those of other portion. The region at which the 2DEG is broken may be referred to as a 'disconnected region'. Due to the disconnected region, a HEMT according to example embodiments may have a normally-off characteristic. The disconnected region may be formed by the depletion forming layer DP10 on the recess region R10.

The depletion forming layer DP10 may be a p-type semiconductor layer or a layer doped with p-type impurities (e.g., p-doped layer). In addition, the depletion forming layer DP10 may include a group III-V based nitride semiconductor. For example, the depletion forming layer DP10 may include at least one of GaN, AlGaN, InN, AlInN, InGaN, and AlInGaN, and may be doped with p-type impurities such as magnesium (Mg). As an example, the depletion forming layer DP10 may be a p-GaN layer or a p-AlGaN layer. The energy bandgap of the channel supply layer CS10 under the depletion layer DP10 may be increased due to the depletion layer DP10, thereby forming the disconnected region in the 2DEG.

A gate electrode G10 may be disposed on the depletion forming layer DP10. The gate electrode G10 may be formed of various metal or metal compounds. The gate electrode G10 may have a width that is similar to or the same as that of the depletion layer DP10. Otherwise, the gate electrode may have a width that is greater than that of the depletion forming layer DP10. In this case, the gate electrode G10 may cover side surfaces of the depletion forming layer DP10, as well as the upper surface of the depletion forming layer DP10. Since the insulating mask layer M10 covers the upper surface of the channel supply layer CS10, electric short between the gate electrode G10 and the channel supply layer CS10 may be limited (and/or prevented) even when the width of the gate electrode G10 is greater than that of the depletion forming layer DP10.

A source electrode S10 and a drain electrode D10 may be disposed on the channel supply layer CS10 at opposite sides of the gate electrode G10. The insulating mask layer M10 may not be disposed between the source electrode S10 and the channel supply layer CS10 and between the drain electrode D10 and the channel supply layer CS10. That is, portions of the insulating mask layer M10 may be removed to expose the channel supply layer CS10, and then, the source electrode S10 and the drain electrode D10 may be formed on the exposed channel supply layer CS10. The source electrode S10 and the drain electrode D10 may be electrically connected to the 2DEG. The source electrode S10 may be closer to the gate electrode G10 than the drain electrode D10 is. That is, a distance between the source electrode S10 and the gate electrode G10 may be less than a distance between the drain electrode D10 and the gate electrode G10. However, this is an example, and relative distances between the source electrode S10 or the drain electrode D10 and the gate electrode G10 may vary. The source electrode S10 and the drain electrode D10 may ohmic contact the channel supply layer CS10. In some cases, an ohmic contact layer (not shown) may be further disposed between the source electrode S10 and the channel supply layer CS10 and between the drain electrode D10 and the channel supply layer CS10.

The source electrode S10 and the drain electrode D10 may have structures inserted into the channel supply layer CS10 or into the channel layer C10. For example, the channel supply layer CS10 and the channel layer C10 are etched (recessed), and then, the source electrode S10 and the drain electrode D10 may be formed in etched regions (recess regions). Here, a depth of the etched region (recess region) may be deeper than that of the 2DEG. Therefore, the source electrode S10 and the drain electrode D10 may directly contact side surfaces of the 2DEG. Otherwise, after etching a portion of the channel supply layer CS10 to a desired (and/or alternatively predetermined) depth, the source and drain electrodes S10 and D10 may be formed. That is, after etching a portion of the channel supply layer CS10 to the interface between the channel layer C10 and the channel supply layer CS10 or to a shallower depth than the interface, the source and drain electrodes S10 and D10 may be formed in the etched region (recess region). Otherwise, configurations of the source and drain electrodes S10 and D10 may be variously modified.

In example embodiments, the insulating mask layer M10 having the opening is disposed on the channel supply layer CS10, and after that, the depletion forming layer DP10 may be selectively grown from the opening. Therefore, when forming the depletion forming layer DP10, the remaining region of the channel supply layer CS10 except for the opening may be protected by the insulating mask layer M10. In this regard, the damage of the channel supply layer CS10 when forming the depletion forming layer DP10 may be reduced (and/or prevented). If a depletion forming layer is formed by growing a p-type material layer on an entire surface of the channel supply layer CS10 without using the insulating mask layer M10 and patterning the p-type material layer, the channel supply layer CS10 may be damaged during the patterning process, thereby degrading characteristics of the 2DEG and increasing channel resistance. Consequently, performances of the HEMT may be degraded, for example, ON-resistance of the HEMT may be increased. However, according to example embodiments, the above problem may be limited (and/or prevented), and the HEMT of excellent performance having a low ON-resistance may be realized.

Also, according to example embodiments, a width of the disconnected region in the 2DEG may be adjusted according to a width of the opening O10 of the insulating mask layer M10. That is, the width of the disconnected region of the 2DEG may be determined by a width of the region where the depletion forming layer DP10 and the channel supply layer CS10 contact each other in the opening. Therefore, when the width of the opening is reduced, the width of the disconnected region in the 2DEG may be also reduced. That is, the width of the disconnected region of the 2DEG may be reduced easily. As the width of the disconnected region is reduced, the ON-resistance of the HEMT may be reduced and the switching speed may be increased. Therefore, in example embodiments, the ON-resistance of the HEMT may be easily reduced and the switching speed may be increased by reducing the width of the disconnected region.

Furthermore, according to example embodiments, the threshold voltage of the HEMT may be easily adjusted according to the thickness of the channel supply layer CS10 and doping concentration of the depletion forming layer DP10.

Figure 2A:
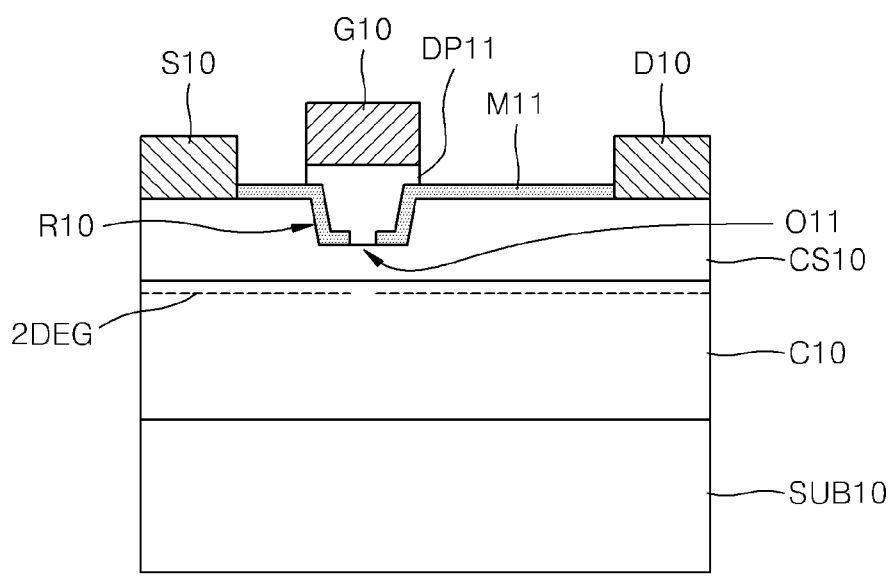
FIG. 2A is a cross-sectional view of a HEMT according to example embodiments.
Figure 2B:
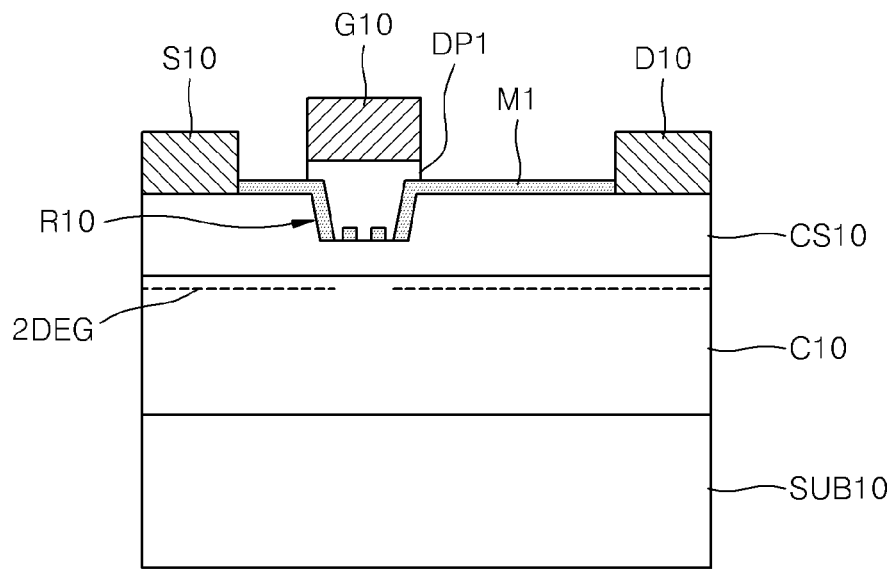
FIG. 2B is a cross-sectional view of a HEMT according to example embodiments.

According to example embodiments, the bottom surface of the recess region R10, which is not covered by the insulating mask layer M10 in FIG. 1, may be partially covered by an insulating mask layer M11 as shown in FIG. 2A or an insulating mask layer M1 as shown in FIG. 2B. FIGS. 2A and 2B show HEMTs according to example embodiments, in which the insulating mask layer M10 and the depletion forming layer DP10 of FIG. 1 are modified.

Referring to FIG. 2A, an insulating mask layer M11 may have an extended structure so as to cover opposite end portions (outer portions) of the bottom surface in the recess region R10. Therefore, the insulating mask layer M11 may cover some portions (opposite end portions) of the bottom surface of the recess region R10, the inner side surface of the recess region R10, and the upper surface of the channel supply layer CS10. A center portion of the bottom surface in the recess region R10 or a portion adjacent to the center portion may not be covered by the insulating mask layer M11 and may be exposed. When the portion of the insulating mask layer M11 covering the opposite end portions of the bottom surface in the recess region R10 is denoted as an 'extended portion', the extended portion may be extended in a direction in parallel with the insulating mask layer M11 that is disposed on the upper surface of the channel supply layer CS10. A size of the exposed portion of the channel supply layer CS10 may be reduced by the extended portion. That is, the exposed region of the recess region R10, which is not covered by the insulating mask layer M11, is smaller than that of FIG. 1. In other words, a width of the opening O11 in the insulating mask layer M11 is less than that of the opening O10 in the insulating mask layer M10 of FIG. 1. Therefore, a width of the contact region between the channel supply layer CS10 and the depletion forming layer DP11 is reduced, and accordingly, the width of the broken region of the 2DEG due to the depletion forming layer DP11, that is, the disconnected region, may be reduced. As the width of the disconnected region is reduced, the ON-resistance of the HEMT may be reduced and the switching speed may be increased. Thus, the ON-resistance of some HEMTs according to example embodiments may be lower than that of the HEMT shown in FIG. 1, and the switching speed may be faster than that of the HEMT shown in FIG. 1. Therefore, the structure shown in FIG. 2A may be advantageous for improving the performance of the HEMT.

Referring to FIG. 2B, the insulating mask layer M1 may be similar to the insulating mask M11 in FIG. 2A, except the insulating mask layer M1 may define more than one opening that exposes the channel supply layer CS10.

Figure 3:
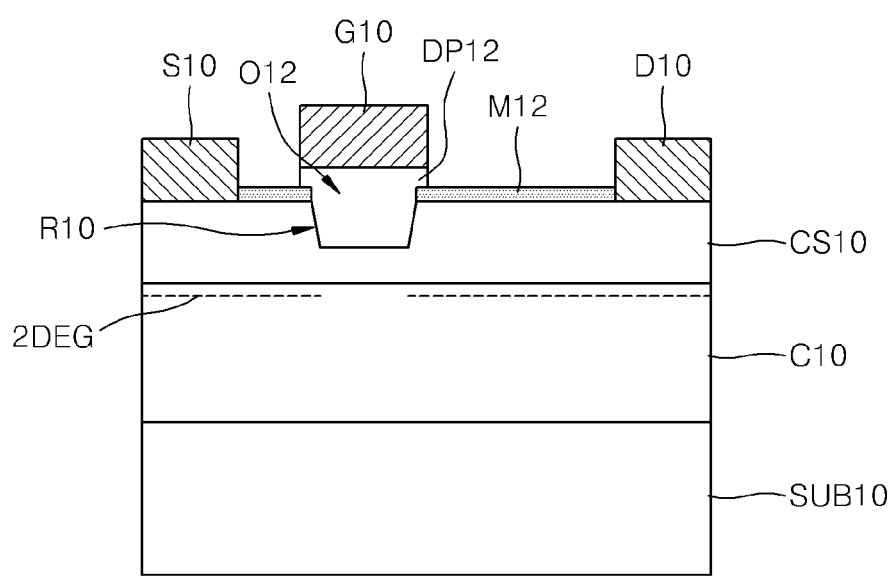
FIG. 3 is a cross-sectional view of a HEMT according to example embodiments.

According to example embodiments, the insulating mask layer may be arranged so an inner side surface of the recess region R10 is not covered by the insulating mask layer. For example, as shown in FIG. 3, a HEMT according to example embodiments may include an insulating mask layer M12 that is on the upper surface of the channel supply layer CS10 except for the recess region R10. FIG. 3 shows a structure in which the insulating mask layer M10 and the depletion forming layer DP10 of FIG. 1 are modified.

Referring to FIG. 3, an insulating mask layer M12 is disposed defining an opening O12 on the upper surface of the channel supply layer CS10 except for the recess region R10. However, the insulating mask layer M12 may not be disposed between the source electrode S10 and the channel supply layer CS10 and between the drain electrode D10 and the channel supply layer CS10. In this case, a depletion forming layer DP12 may be grown from the bottom surface and the inner side surface of the recess region R10. Remaining structures except for the shapes of the insulating mask layer M12 and the depletion forming layer DP12 may be the same hose of FIG. 1.

In the structures shown in FIGS. 1 through 3, the recess region R10 is formed to a depth shallower than the interface between the channel layer C10 and the channel supply layer CS10, however the depth of the recess region R10 may vary. For example, the recess region R10 may be formed to the interface between the channel layer C10 and the channel supply layer CS10. FIGS. 4A, 4B, and 5 through 6 show the cases in which the recess region R10 of FIGS. 1 through 3 is formed to the interface between the channel layer C10 and the channel supply layer CS10, respectively.

Figure 4A:
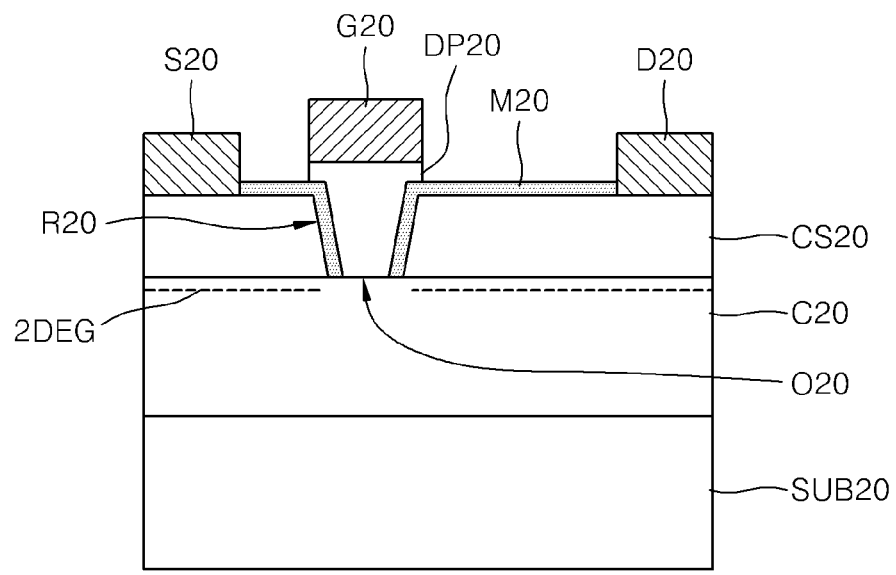
FIG. 4A is a cross-sectional view of a HEMT according to example embodiments.

Referring to FIG. 4A, a recess region R20 is formed to an interface between a channel layer C20 and a channel supply layer CS20, and an insulating mask layer M20 defining an opening O20 covers an inner side surface of the recess region R20 and an upper surface of the channel supply layer C520. A depletion forming layer DP20 may be grown from a bottom surface of the recess region R20. A disconnected region may exist in a 2DEG corresponding to the recess region R20.

Figure 4B:
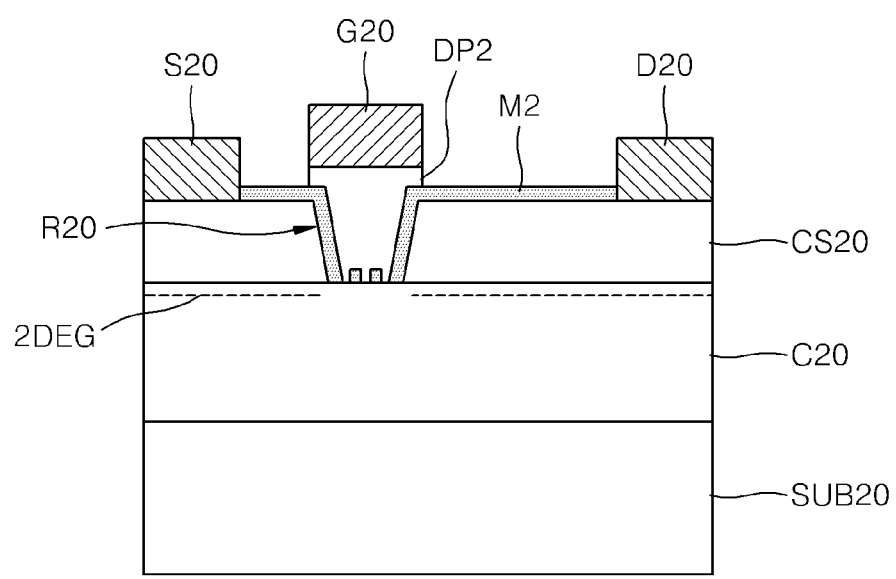
FIG. 4B is a cross-sectional view of a HEMT according to example embodiments.

Referring to FIG. 4B, a HEMT according to example embodiments may be similar to the HEMT illustrated in FIG. 4A, except the insulating mask layer M2 in FIG. 4B defines a plurality of openings that expose the channel supply layer C520. The depletion forming layer DP2 may extend into the openings defined by the insulating mask layer M2.

Figure 5:
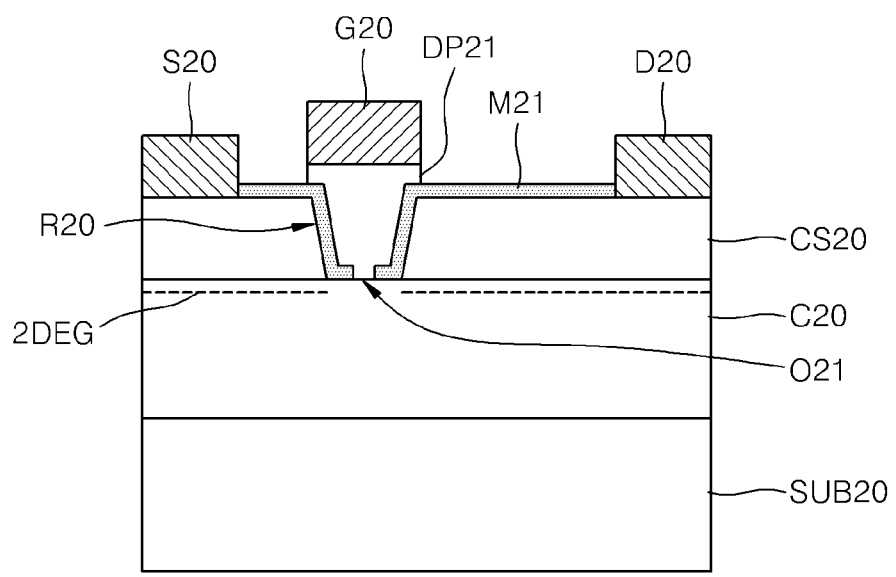
FIG. 5 is a cross-sectional view of a HEMT according to example embodiments.

Referring to FIG. 5, the recess region R20 is formed to the interface between the channel layer C20 and the channel supply layer CS20, and the insulating mask layer M21 defining an opening O21 covers a portion of the bottom surface of the recess region R20 (opposite end portions), the inner side surface of the recess region R20, and the upper surface of the channel supply layer CS20. A center portion of the bottom surface of the recess region R20 or a region adjacent to the center portion may not be covered by the insulating mask layer M21. The insulating mask layer M21 may be similar to the insulating mask layer M11 of FIG. 2. The depletion forming layer DP21 may be grown from the exposed portion of the bottom surface of the recess region R20 (exposed portion of the channel layer). A disconnected region may exist in the 2DEG corresponding to the recess region R20.

Figure 6:
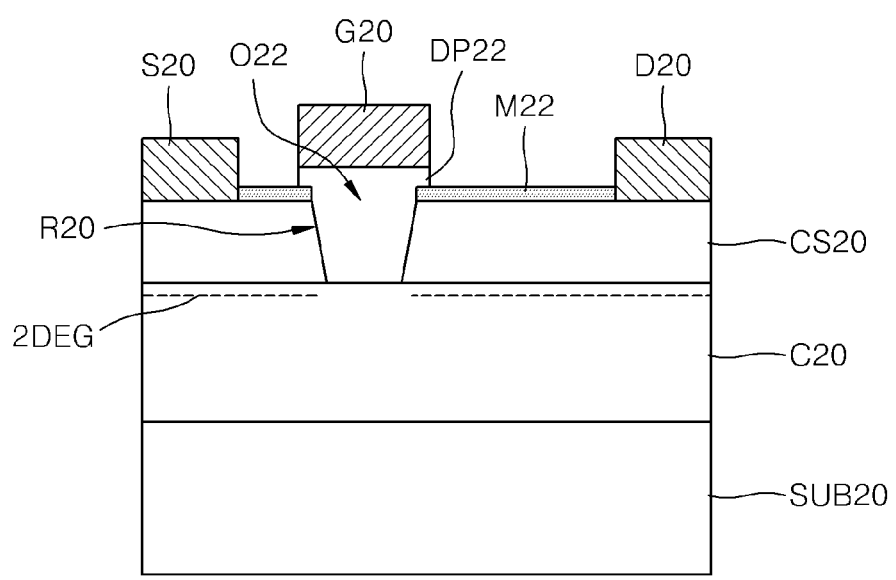
FIG. 6 is a cross-sectional view of a HEMT according to example embodiments.

Referring to FIG. 6, the recess region R20 is formed to the interface between the channel layer C20 and the channel supply layer CS20, and an insulating mask layer M22 defining an opening O22 covers the upper surface of the channel supply layer CS20 except for the recess region R20. The insulating mask layer M22 is similar to the insulating mask layer M12 of FIG. 3. The depletion forming layer DP22 may be grown from the bottom surface and the inner side surface of the recess region R20.

In FIGS. 4A, 4B, and 5 through 6, reference numerals SUB20, G20, S20, and D20 respectively denote a substrate, a gate electrode, a source electrode, and a drain electrode that correspond to the substrate SUB10, the gate electrode G10, the source electrode S10, and the drain electrode D10 shown in FIG. 1, and thus, descriptions thereof are not provided.

In FIGS. 4A, 4B, and 5 through 6, since the recess region R20 is formed to the interface between the channel layer C20 and the channel supply layer CS20, the disconnected region in the 2DEG may be formed due to the recess region R20. That is, since there is no interface between the channel layer C20 and the channel supply layer CS20 in the recess region R20, the 2DEG may not be formed in the recess region R20. The depletion forming layer DP20, DP2, DP21, or DP22 may increase the width of the disconnected region. In particular, in FIGS. 4A and 6, the width of the disconnected region may be increased by the depletion forming layer DP20 or DP22. In FIG. 5, since the width of the opening in the insulating mask layer M21 is narrow, the effect of increasing the width of the disconnected region in the 2DEG due to the depletion forming layer DP21 may be small. Thus, the width of the disconnected region in the HEMT according to example embodiments in FIG. 5 may be less than those of FIGS. 4A and 6.

Since the width of the disconnected region in the 2DEG may depend upon the width of a lower end portion of the recess region R20 in the HEMTs according to example embodiments shown in FIGS. 4A, 4B, 5 through 6, the width of the recess region R20 may be reduced in order to reduce the ON-resistance of the HEMT. Thus, the width of the recess region R20 (the width of the lower end portion) may be reduced to about 0.5 μm or less. As the width of the recess region R20 is reduced, the width of the disconnected region in the 2DEG may be reduced, the ON-resistance of the HEMT may be lowered, and the switching speed may become faster.

Additionally, since the depletion forming layers DP20, DP2, and DP21 are grown only from the exposed portion of the channel layer C20 in FIGS. 4A, 4B, and 5, crystallinity of the depletion forming layers DP20, and DP21 may have improved. In particular, if the depletion forming layers DP20 and DP21 are formed of the same kind of material as that of the channel layer C20, the crystallinity of the depletion forming layers D20 and D21 may be improved. For example, if the channel layer C20 is a GaN layer, the depletion layers DP20, DP2 and DP21 having excellent crystallinity may be obtained when the depletion layers DP20, DP2, and DP21 are formed as p-GaN layers.

In FIGS. 1 through 6, the recess region R10 or R20 is formed, the insulating mask layer M10-M12, M1 or M2, M20-M22 exposing at least a portion of the recess region R10 or R20 is formed, and then, the depletion forming layer DP1, DP10-DP12 or DP2, DP20-DP22 is formed on the exposed portion of the recess region R10 or R20. However, according to example embodiments, the recess region R10 or R20 may be omitted as shown in FIG. 7.

Figure 7:
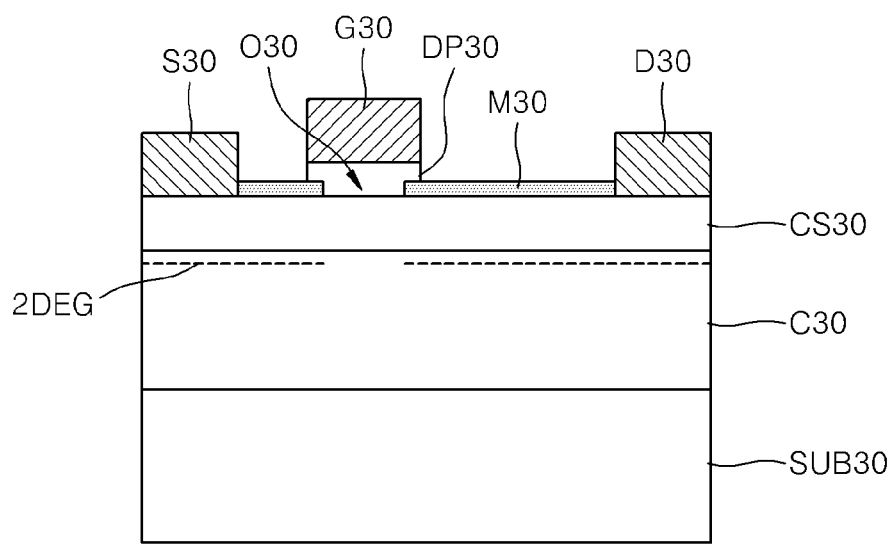
FIG. 7 is a cross-sectional view of a HEMT according to example embodiments.

Referring to FIG. 7, a channel layer C30 may be disposed on a substrate SUB30, and a channel supply layer CS30 that induces a 2DEG in the channel layer C30 may be disposed on the channel layer C30. An insulating mask layer M30 having an opening O30 that exposes a portion of the channel supply layer CS30 may be disposed on the channel supply layer CS30. A depletion forming layer DP30 may be disposed on the exposed portion of the channel supply layer CS30, which is exposed by the opening of the insulating mask layer M30. When forming the depletion forming layer DP30, the region (upper surface) of the channel supply layer CS30 except for the region where the depletion forming layer DP30 (e.g., opening) is exposed may be covered by the insulating mask layer M30. Therefore, the depletion forming layer DP30 may be selectively grown only from the opening. A portion of the insulating mask layer M30 may be located between an end portion of the depletion forming layer DP30 and the channel supply layer CS30, and another portion of the insulating mask layer M30 may be located between the other end of the depletion forming layer DP30 and the channel supply layer CS30. That is, an end of the depletion forming layer DP30 may extend over the insulating mask layer M30, and the other end of the depletion forming layer DP30 may extend over the insulating mask layer M30. A gate electrode G30 may be disposed on the depletion forming layer DP30, and a source electrode S30 and a drain electrode D30 may be disposed on opposite sides of the gate electrode G30. A portion of the insulating mask layer M30 may be removed to expose the channel supply layer CS30, and then, the source and drain electrodes S30 and D30 may be disposed on the exposed portion of the channel supply layer CS30.

In example embodiments, as shown in FIG. 7, a disconnected region may be formed in the 2DEG by the depletion forming layer DP30. To do this, a thickness of the channel supply layer CS30 may be thin. That is, the thickness of the channel supply layer CS30 may be about 15 nm or less, for example, about 10 to 15 nm. When the channel supply layer CS30 has a relatively thin thickness, the 2DEG corresponding to the depletion forming layer DP30 may be depleted by the depletion forming layer DP30 without forming the recess region. That is, the disconnected region may be formed in the 2DEG by the depletion forming layer DP30.

Figure 8:
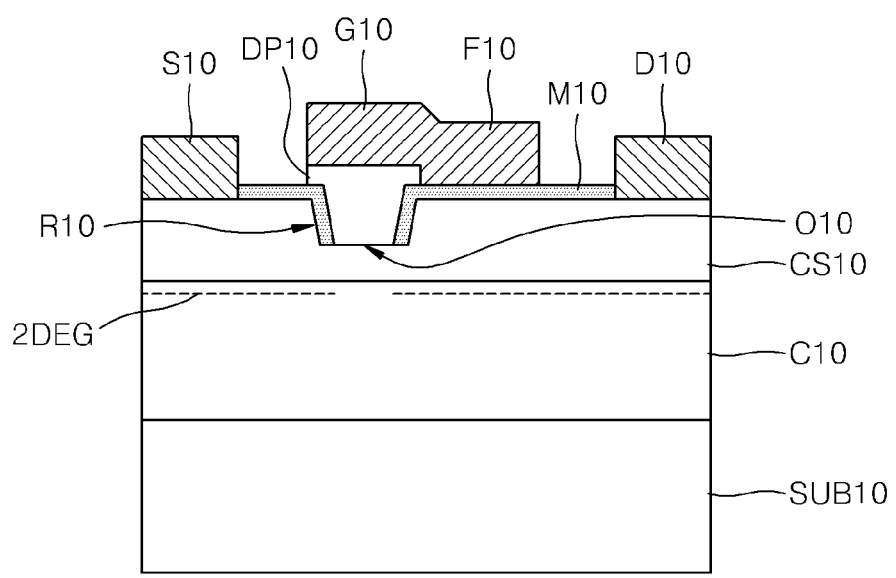
FIG. 8 is a cross-sectional view of a HEMT according to example embodiments.
Figure 9:
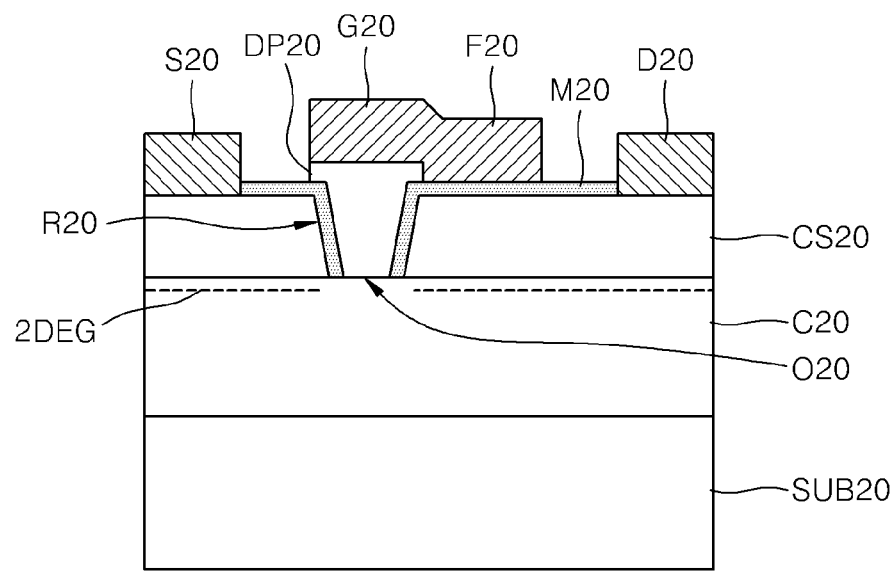
FIG. 9 is a cross-sectional view of a HEMT according to example embodiments.

According to example embodiments, the structures shown in FIGS. 1 through 7 may further include a field plate extended from the gate electrode G10, G20, and G30. FIGS. 8 and 9 respectively show that field plates F10 and F20 are additionally formed in the HEMTs according to example embodiments of FIGS. 1 and 4A.

Referring to FIGS. 8 and 9, the field plates F10 and F20 extending from the gate electrodes G10 and G20 may be further formed. The field plates F10 and F20 may extend over (onto) the insulating mask layers M10 and M20 between the gate electrodes G10 and G20 and the drain electrodes D10 and D20. The field plates F10 and F20 may disperse an electric field between the gate electrodes G10 and G20 and the drain electrodes D10 and D20. In more detail, in the structures shown in FIGS. 1 and 4A, an electric field and a voltage may be concentrated on portions of the channel layers C10 and C20, which correspond to edges of the gate electrodes G10 and G20 at drain sides. However, as shown in FIGS. 8 and 9, when the field plates F10 and F20 are formed, the concentration of the electric field and the voltage may be reduced, and accordingly, a breakdown problem may be limited (and/or suppressed) and a withstand voltage property may be improved.

FIGS. 10A through 10E are cross-sectional views illustrating a method of manufacturing a HEMT according to example embodiments.

Figure 10A:
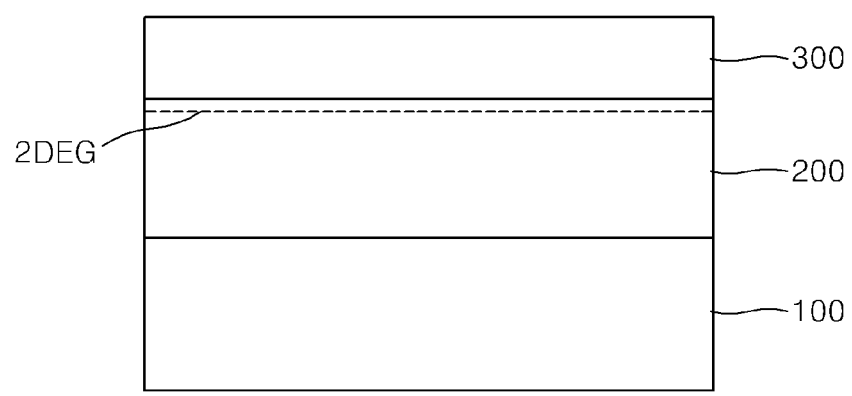
FIGS. 10A through 10E are cross-sectional views illustrating a method of manufacturing a HEMT, according to example embodiments.

Referring to FIG. 10a, a channel layer 200 may be formed on a substrate 100. The substrate 100 may include, for example, sapphire, Si, SiC, GaN, direct-bonded copper (DBC), or the like. However, the substrate 100 is not limited thereto, but may be modified variously. The channel layer 200 may be a semiconductor layer. The channel layer 200 may include a group III-V based compound semiconductor. For example, the channel layer 200 may include a GaN-based material (e.g., GaN). In this case, the channel layer 200 may be an updoped GaN layer, in some cases, may be a GaN layer doped with desired (and/or alternatively predetermined) impurities. Although not shown in the drawings, a desired (and/or alternatively predetermined) buffer layer may be further formed between the substrate 100 and the channel layer 200. The buffer layer may be formed to reduce differences in lattice constant and thermal expansion coefficient between the substrate 100 and the channel layer 200, thereby preventing the crystallinity of the channel layer 100 from degrading. The buffer layer may have a single-layered or multi-layered structure including at least one nitride containing at least one of Al, Ga, In, and B. In more detail, the buffer layer may be formed to have a single-layered or multi-layered structure including at least one of various materials consisting of AlN, GaN, AlGaN, InGaN, AlInN, and AlGaInN. Additionally, a seed layer (not shown) may be further formed between the substrate 100 and the buffer layer. The seed layer may be a base layer for growing the buffer layer.

A channel supply layer 300 may be formed on the channel layer 200. The channel supply layer 300 may be formed of different semiconductor from the channel layer 200. The channel supply layer 300 may be a layer inducing a 2DEG in the channel layer 200. The 2DEG may be formed in the channel layer 200 under an interface between the channel layer 200 and the channel supply layer 300. The channel supply layer 300 may be formed of a material (semiconductor) having different polarization characteristic and/or energy bandgap and/or lattice constant from those of the channel layer 200. The channel supply layer 300 may be formed of a material (semiconductor) having higher polarizability and/or wider energy bandgap than those of the channel layer 200. For example, the channel supply layer 300 may be formed to have a single-layered or multi-layered structure including at least one nitride containing at least one of Al, Ga, In, and B. In more detail, the channel supply layer 300 may have a single-layered or multi-layered structure including at least one of various materials consisting of AlGaN, AlInN, InGaN, AlN, and AlInGaN. The channel supply layer 300 may be an updoped layer, or may be a layer doped with desired (and/or alternatively predetermined) impurities. The channel supply layer 300 may be formed to a thickness of several tens of nm or less, for example, about 50 nm or less.

Figure 10B:
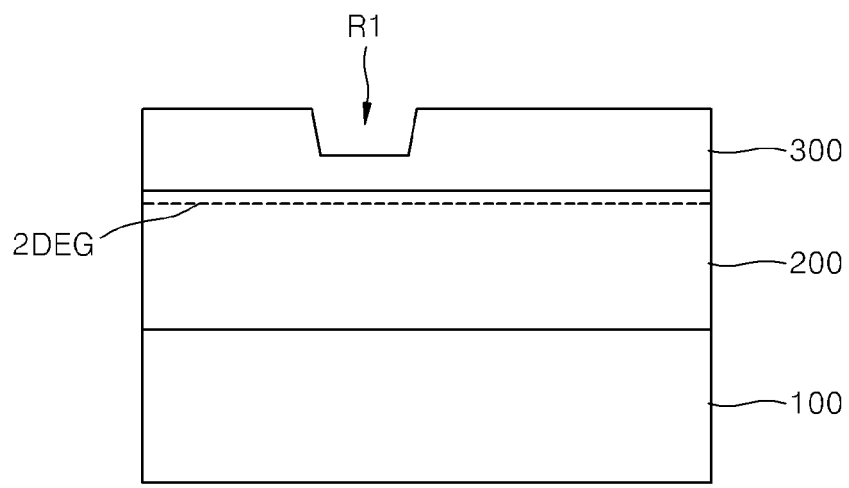

Referring to FIG. 10B, a portion of the channel supply layer 300 may be etched to form a recess region R1. The recess region R1 may be formed to a depth that is shallower than the interface between the channel layer 200 and the channel supply layer 300. Here, the recess region R1 may be formed to a depth at which the corresponding 2DEG may be maintained. If the recess region R1 is formed to a depth that is too deep, the 2DEG corresponding to the recess region R1 may be removed. In example embodiments, the recess region R1 may be formed to a depth at which the 2DEG corresponding to the recess region R1 may not be removed. For example, if about 5 nm or greater thickness of the channel supply layer 300 remains in the recess region R1, the 2DEG may be maintained in the recess region R1.

Figure 10C:
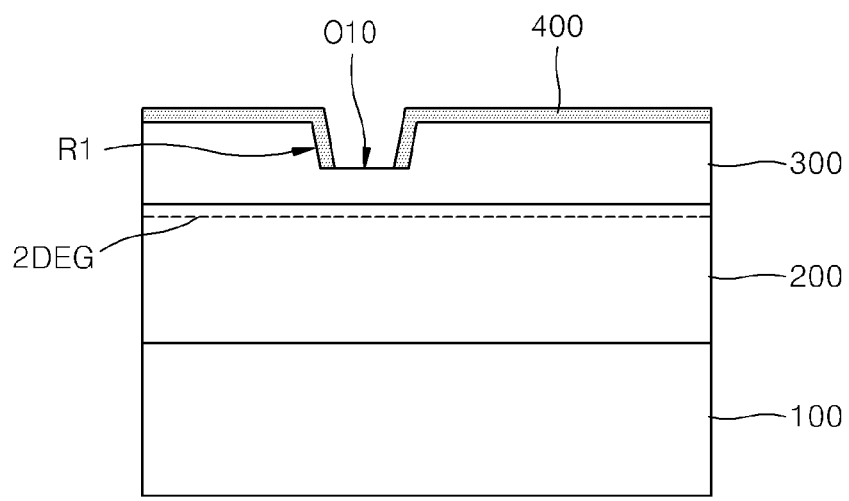

Referring to FIG. 10C, an insulating mask layer 400 having an opening exposing at least a portion of the recess region R1 may be formed on the channel supply layer 300. The insulating mask layer 400 may be formed of an insulating material such as silicon oxide, silicon oxynitride, or silicon nitride, and may have a single-layered or multi-layered structure. The insulating mask layer 400 may cover an inner side surface of the recess region R1 and an upper surface of the channel supply layer 300. Most of a bottom surface of the recess region R1 (remaining region except for opposite ends of the bottom surface) may not be covered by the insulating mask layer 400. A desired (and/or alternatively predetermined) insulating material layer may be formed on an entire surface of the channel supply layer 300 including the recess region R1, and then, a portion of the insulating material layer formed on the bottom surface of the recess region R1 may be removed to form the insulating mask layer 400. However, the above described method is an example of forming the insulating mask layer 400, and the insulating mask layer 400 shown in FIG. 10C may be formed in various manners.

Figure 10D:
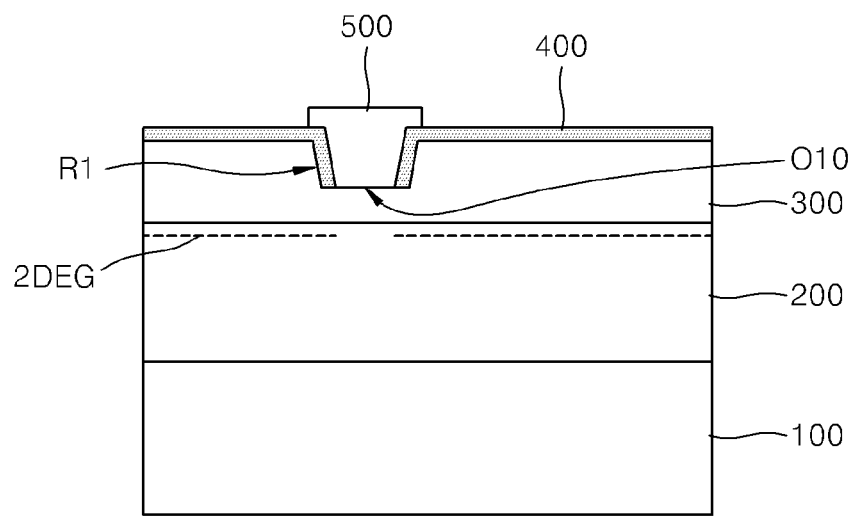

Referring to FIG. 10D, a depletion forming layer 500 may be selectively formed on the bottom surface of the recess region R1, which is not covered by the insulating mask layer 400. The depletion forming layer 500 may be formed in an epitaxial growth method. The energy bandgap of the channel supply layer 300 under the depletion forming layer 500 may be increased due to the depletion forming layer 500, and accordingly, a depletion region may be formed in the 2DEG in the portion of the channel supply layer 300, which corresponds to the depletion forming layer 500. Therefore, the portion of the 2DEG, which corresponds to the depletion forming layer 500, may be disconnected. Otherwise, the 2DEG portion corresponding to the depletion forming layer 500 may have different characteristics (electron density, etc.) from those of the other portion. In example embodiments, a disconnected region is formed in the 2DEG due to the depletion forming layer 500. The depletion forming layer 500 may be formed as a p-type semiconductor layer, or a layer doped with p-type impurities (e.g., p-doping layer). Also, the depletion forming layer 500 may include a group III-V based nitride semiconductor. For example, the depletion forming layer 500 may include at least one of GaN, AlGaN, InN, AlInN, InGaN, and AlInGaN, and may include p-type impurities such as Mg. In more detail, the depletion forming layer 500 may be formed as a p-GaN layer or a p-AlGaN layer.

Figure 10E:
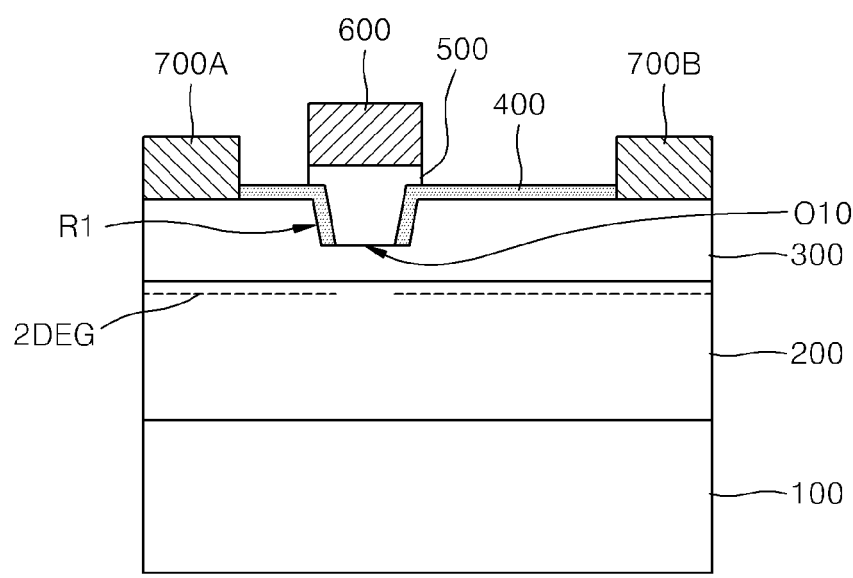

Referring to FIG. 10E, a gate electrode 600 may be formed on the depletion forming layer 500. The gate electrode 600 may be formed of various metal or metal compounds. A source electrode 700A and a drain electrode 700B may be formed on opposite sides of the gate electrode 600. After exposing the channel supply layer 30 by removing a portion of the insulating mask layer 400, the source electrode 700A and the drain electrode 700B may be formed on the exposed channel supply layer 300. The source electrode 700A may be closer to the gate electrode 600 than the drain electrode 700B is. In other words, a distance between the source electrode 700A and the gate electrode 600 may be less than a distance between the drain electrode 700B and the gate electrode 600. However, example embodiments are not limited thereto, and the relative distances between the source electrode 700A and the drain electrode 700B, and the gate electrode 600 may vary. The source electrode 700A and the drain electrode 700B may form ohmic contact with the channel supply layer 300. If necessary, an ohmic contact layer (not shown) may be further formed between the source electrode 700A and the channel supply layer 300 and the drain electrode 700B and the channel supply layer 300.

The source electrode 700A and the drain electrode 700B may be inserted into the channel supply layer 300 or the channel layer 200. For example, some portions of the channel supply layer 300 and the channel layer 200 are etched (recessed), and after that, the source and drain electrodes 700A and 700B may be formed on the etched region (recessed region). Here, a depth of the etched region (recess region) may be deeper than the depth of the 2DEG. Therefore, the source and drain electrodes 700A and 700B may directly contact a side surface of the 2DEG. Otherwise, after etching a portion of the channel supply layer 300 to a desired (and/or alternatively predetermined) depth, the source and drain electrodes 700A and 700B may be formed. That is, after etching a portion of the channel supply layer 300 to the interface between the channel layer 200 and the channel supply layer 300 or to a shallower depth than the interface, the source and drain electrodes 700A and 700B may be formed on the etched region (recessed region). Otherwise, the configurations of the source and drain electrodes 700A and 700B may be modified variously.

According to example embodiments, the insulating mask layer 400 having the opening is disposed on the channel supply layer 300, and then, the depletion forming layer 500 may be selectively on the opening. Therefore, when forming the depletion forming layer 500, the entire region of the channel supply layer 300 except for the opening may be protected by the insulating mask layer 400. Regarding to this, when forming the depletion forming layer 500, damage of the channel supply layer 300 may be prevented. If the depletion forming layer is formed by growing a p-type material layer on the entire surface of the channel supply layer 300 and patterning the p-type material layer without using the insulating mask layer 400, the channel supply layer 300 may be damaged during the patterning process, thereby degrading the characteristics of the 2DEG and increasing the channel resistance. Accordingly, performance of the HEMT may be degraded, for example, an ON-resistance of the HEMT may be increased. However, according to example embodiments, the above problem may be addressed, and the HEMT having excellent performance of low ON-resistance may be realized.

Also, according to example embodiments, a width of the disconnected region of the 2DEG may be adjusted according to a width of the opening of the insulating mask layer 400. That is, the width of the disconnected region of the 2DEG may be determined according to a width of a region where the depletion forming layer 500 and the channel supply layer 300 contact each other in the opening. Therefore, the width of the disconnected region in the 2DEG may be reduced by reducing the width of the opening. That is, the width of the disconnected region in the 2DEG may be easily reduced. As the width of the disconnected region is reduced, the On-resistance of the HEMT may be reduced and the switching speed may be increased. Therefore, according to example embodiments, the ON-resistance of the HEMT may be reduced easily and the switching speed may be increased easily by reducing the width of the disconnected region.

Also, according to example embodiments, a threshold voltage of the HEMT may be easily controlled by adjusting the thickness of the channel supply layer 300 and a doping concentration of the channel supply layer 300 and the depletion layer 500.

Figure 11A:
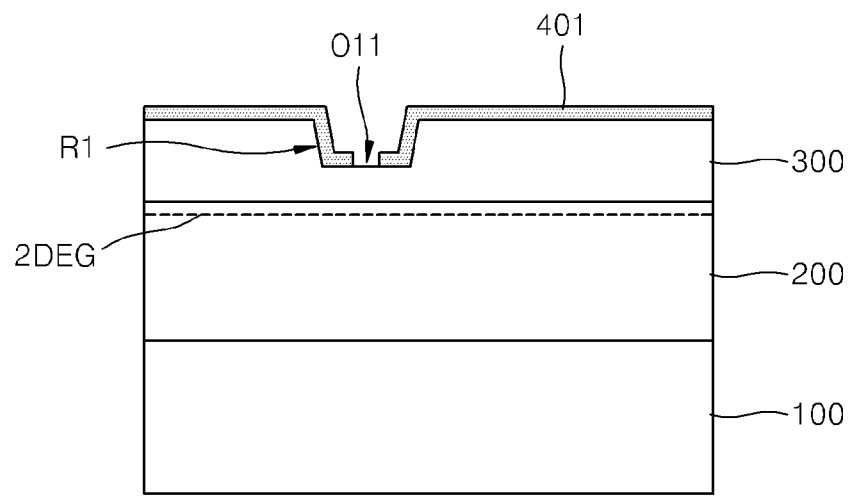
FIGS. 11A and 11B are cross-sectional views illustrating a method of manufacturing a HEMT, according to example embodiments.

According to example embodiments, the insulating mask layer 400 may be modified in the process of FIG. 10C. For example, the insulating mask layer 400 may be transformed so as to cover the bottom surface of the recess region R1 further, as shown in FIG. 11A. Hereinafter, a method of manufacturing a HEMT according to example embodiments will be described with reference to FIGS. 11A and 11B.

Referring to FIG. 11A, an insulating mask layer 401 may extend so as to cover opposite end portions (outer portions) of the bottom surface of the recess region R1. Therefore, the insulating mask layer 401 may cover a portions of the bottom surface of the recess region R1 (opposite end portions), the inner side surface of the recess region R1, and the upper surface of the channel supply layer 300. The exposed region that is not covered by the insulating mask layer 401 may be a center portion of the bottom surface of the recess region R1 or an adjacent region thereto. The exposed region of the recess region R1, which is not covered by the insulating mask layer 401, is smaller than that of FIG. 10C. That is, a width of an opening in the insulating mask layer 401 is less than that of the insulating mask layer 400 shown in FIG. 10C.

Figure 11B:
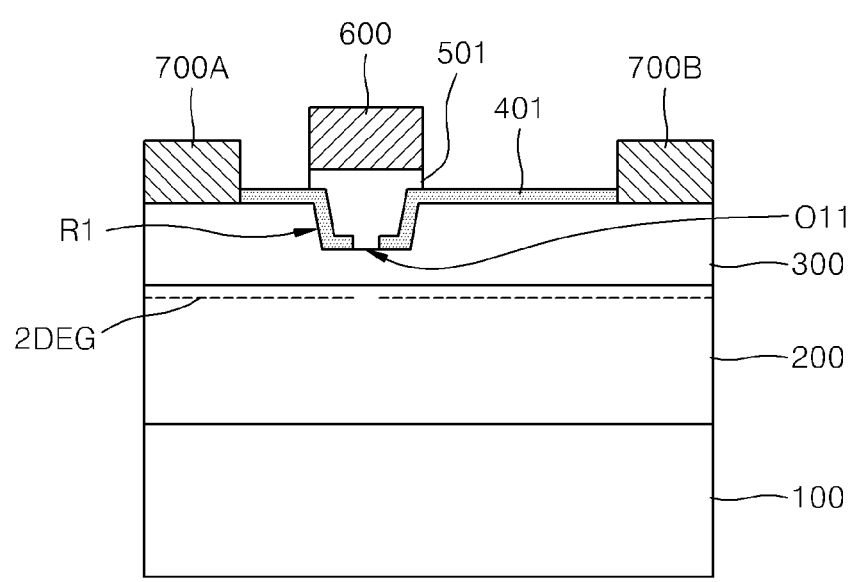

Referring to FIG. 11B, a depletion forming layer 501 may be grown from a portion of the bottom surface of the recess region R1 (center or adjacent portion), which is not covered by the insulating mask layer 401. Next, the gate electrode 600 may be formed on the depletion forming layer 501, and the source and drain electrodes 700A and 700B may be formed on the opposite sides of the gate electrode 600.

A width of a contact region between the depletion forming layer 501 and the channel supply layer 300 in FIG. 11B is less than that of FIG. 10E. Therefore, a width of broken region of the 2DEG due to the depletion forming layer 501, that is, a disconnected region, is less than that of FIG. 10E. As the width of the disconnected region is reduced, the ON-resistance of the HEMT may be reduced and the switching speed may be increased. Accordingly, the ON-resistance of the HEMT according to example embodiments may be lower than that of FIG. 10E, and the switching speed according to example embodiments may be faster than that of FIG. 10E.

Figure 12A:
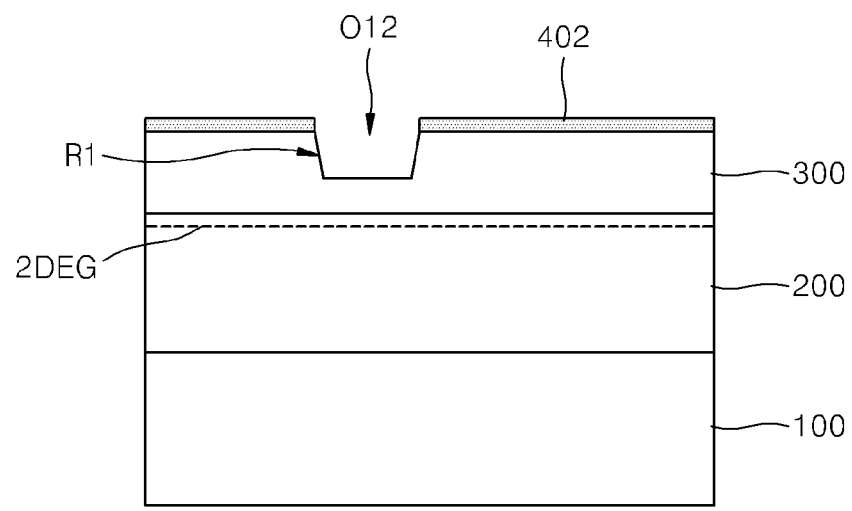
FIGS. 12A and 12B are cross-sectional views illustrating a method of manufacturing a HEMT, according to example embodiments.

According to example embodiments, the insulating mask layer 400 may not cover the inner side surface of the recess region R1 in the process shown in FIG. 10C. That is, the insulating mask layer 400 may be formed only on the upper surface of the channel supply layer 300 except for the recess region R1, without covering the bottom surface and the inner side surface of the recess region R1, as shown in FIG. 12A. Hereinafter, a method of manufacturing a HEMT according to example embodiments will be described with reference to FIGS. 12A and 12B.

Referring to FIG. 12A, the insulating mask layer 402 may be formed on the upper surface of the channel supply layer 300 except for the recess region R1. The bottom surface and the inner side surface of the recess region R1 may not be covered by an insulating mask layer 402, but may be exposed.

Figure 12B:
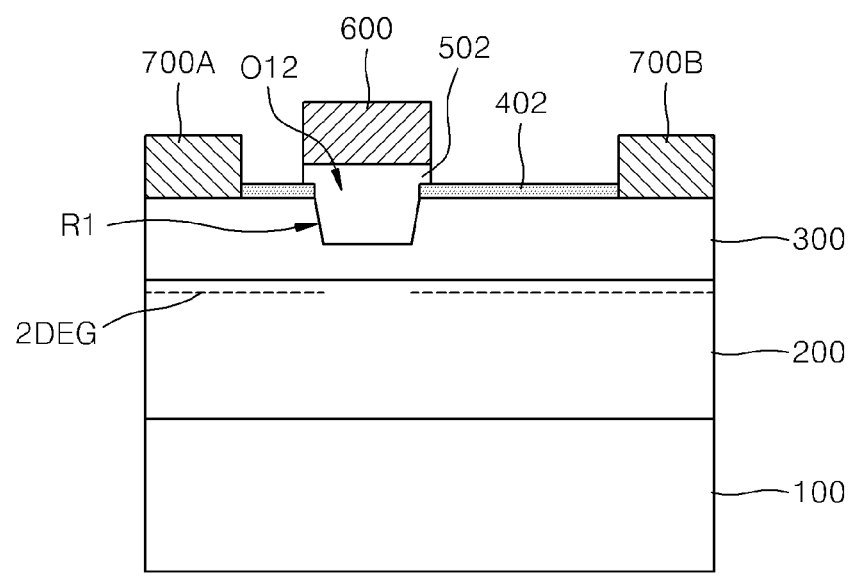

Referring to FIG. 12B, a depletion forming layer 502 may be grown from the bottom surface and the inner side surface of the recess region R1. Both ends of the depletion forming layer 502 may extend over (onto) the insulating mask layer 402. Therefore, a portion of the insulating mask layer 402 may be located between an end of the depletion forming layer 502 and the channel supply layer 300, and another portion of the insulating mask layer 402 may be located between the other end of the depletion forming layer 502 and the channel supply layer 300. Next, the gate electrode 600 may be formed on the depletion forming layer 502, and the source and drain electrodes 700A and 700B may be formed on opposite sides of the gate electrode 600.

In the manufacturing methods illustrated in FIGS. 10A through 10E, FIGS. 11A and 11B, and FIGS. 12A and 12B, the recess region R1 is formed to a depth shallower than the interface between the channel layer 200 and the channel supply layer 300; however, the depth may vary. For example, the recess region R1 may be formed to the interface between the channel layer 200 and the channel supply layer 300. This will be described with reference to FIGS. 13A through 13E.

Figure 13A:
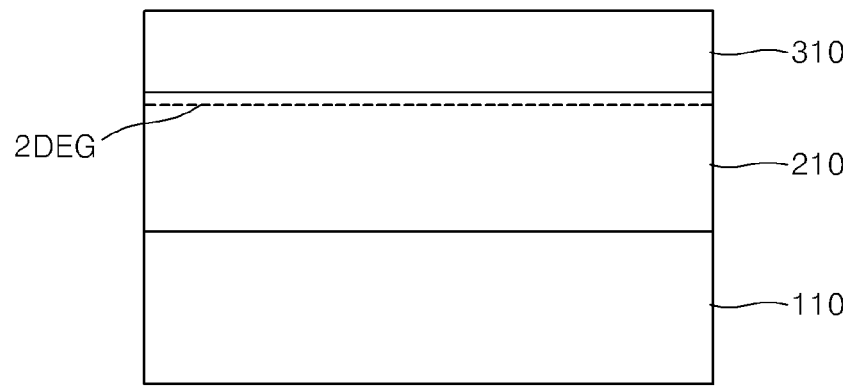
FIGS. 13A through 13E are cross-sectional views illustrating a method of manufacturing a HEMT, according to example embodiments.

Referring to FIG. 13A, a channel layer 210 and a channel supply layer 310 may be sequentially formed on a substrate 110. The substrate 110, the channel layer 210, and the channel supply layer 310 may be respectively similar to or the same as the substrate 100, the channel layer 200, and the channel supply layer 300 shown in FIG. 10A. Although not shown in FIG. 13A, a desired (and/or alternatively predetermined) buffer layer may be further formed between the substrate 110 and the channel layer 210. The buffer layer may be the same as or similar to that described with reference to FIG. 10A.

Figure 13B:
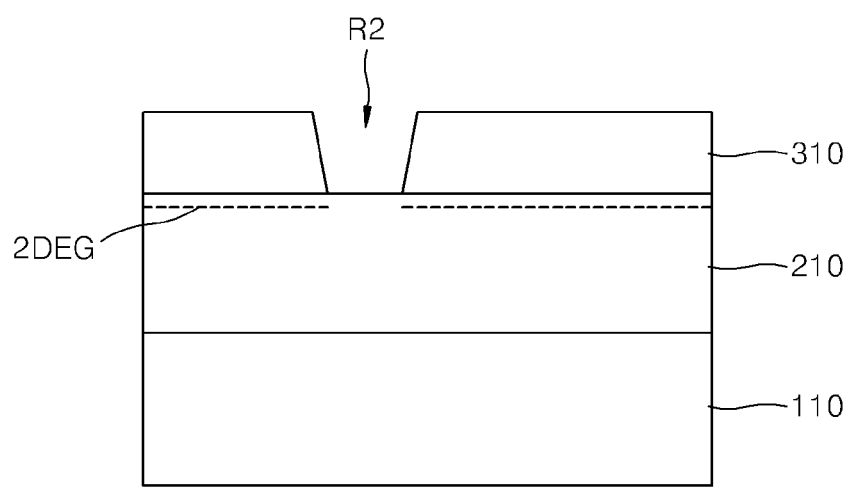

Referring to FIG. 13B, a portion of the channel supply layer 310 may be etched to form a recess region R2. The recess region R2 may be formed to an interface between the channel layer 210 and the channel supply layer 310. In this case, since there is no channel supply layer 310 in the recess region R2, a 2DEG may not be formed in a region corresponding to the recess region R2. That is, a disconnected region of the 2DEG may be formed in a portion of the channel layer 210, which corresponds to the recess region R2.

Figure 13C:
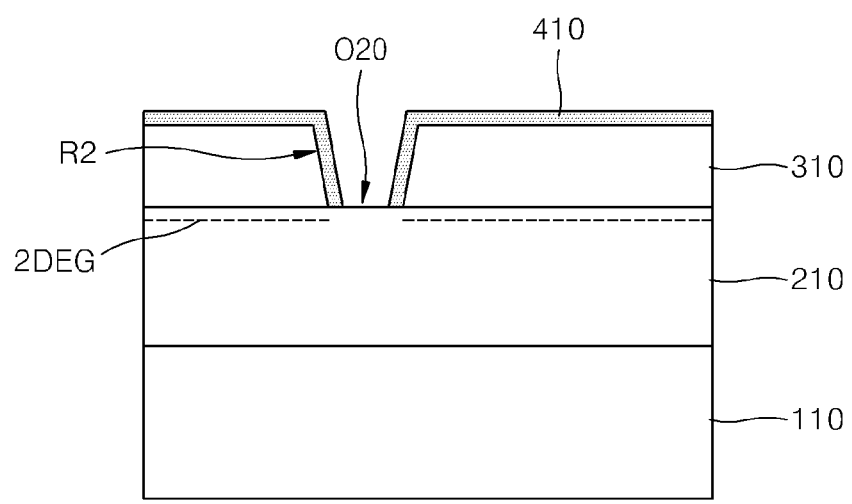

Referring to FIG. 13C, an insulating mask layer 410 having an opening that exposed at least a portion of the recess region R2 may be formed on the channel supply layer 310. The insulating mask layer 410 may cover an inner side surface of the recess region R2 and an upper surface of the channel supply layer 310. Most of the bottom surface of the recess region R2 (remaining region except for opposite ends of the bottom surface) may not be covered by the insulating mask layer 410.

Figure 13D:
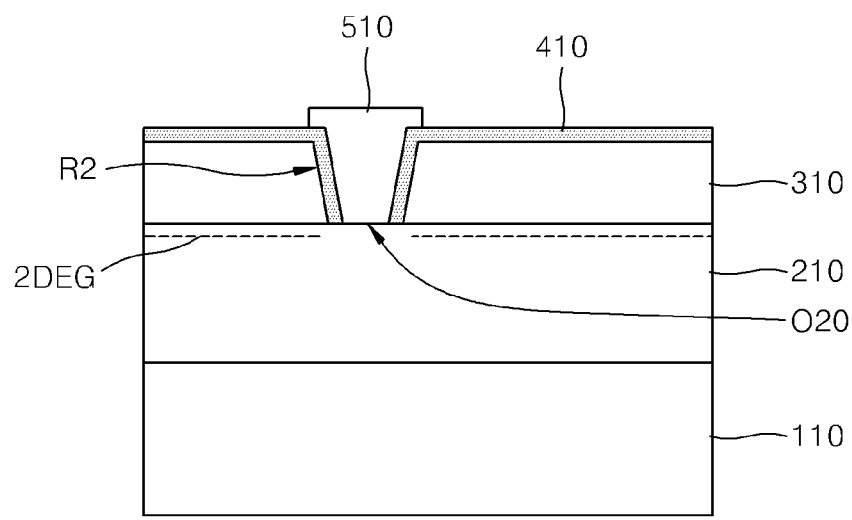

Referring to FIG. 13D, a depletion forming layer 510 may be formed on the bottom surface of the recess region R2. A broken region of the 2DEG (e.g., disconnected region) may be broaden by the depletion forming layer 510. That is, an energy bandgap of the channel supply layer 310 around the depletion forming layer 510 may be increased due to the depletion forming layer 510, and the width of the disconnected region of the 2DEG may be increased. The depletion forming layer 510 may be formed of the similar material to the depletion forming layer 500 of FIG. 10D in the similar way. That is, the depletion forming layer 510 may be formed as a p-type semiconductor layer, or a layer doped with p-type impurities (e.g., p-doping layer). However, in FIG. 13D, the depletion forming layer 510 may be formed of the same kind of material as that of the channel layer 210, while the depletion forming layer 500 in FIG. 10D may be formed of the same kind of material as that of the channel supply layer 300.

Figure 13E:
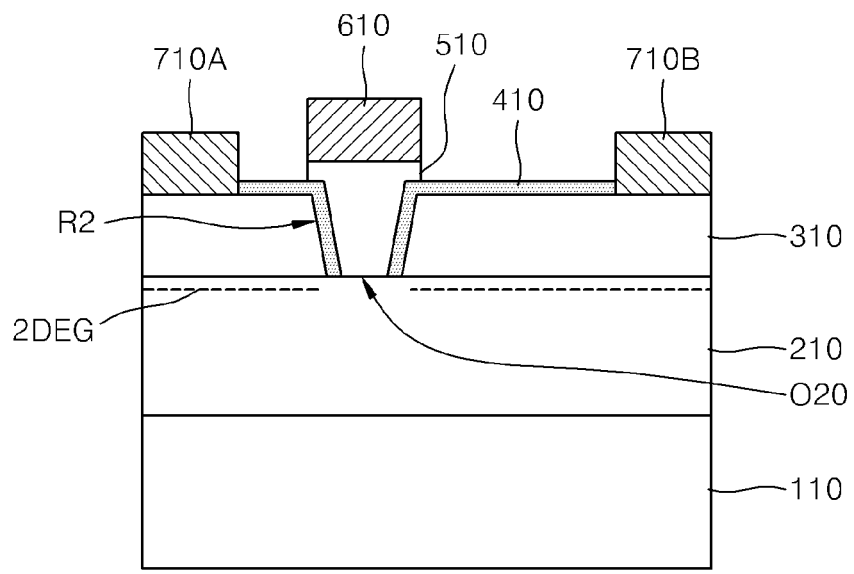

Referring to FIG. 13E, a gate electrode 610 may be formed on the depletion forming layer 510. A source electrode 710A and a drain electrode 710B may be formed on opposite sides of the gate electrode 610. The source and drain electrodes 710A and 710B may contact the channel supply layer 310. Materials, forming methods, and modifications of the gate electrode 610, the source electrode 710A, and the drain electrode 710B may be similar to those described with reference to FIG. 10E.

In FIGS. 13A through 13E, the width of the disconnected region in the 2DEG may be dependent upon the width of the lower end portion of the recess region R2, the width of the recess region R2 may be reduced in order to reduce the ON-resistance of the HEMT. Regarding to this, the width of the recess region R2 (width of the lower end portion) may be reduced to about 0.5 µm or less. As the width of the recess region R2 is reduced, the width of the disconnected region in the 2DEG may be reduced, and accordingly, the ON-resistance of the HEMT may be reduced and the switching speed may be increased.

According to example embodiments, the insulating mask layer 410 of FIG. 13C may be modified variously. For example, the insulating mask layer 410 of FIG. 13C may be modified similar to the insulating mask layer 401 of FIG. 11A or the insulating mask layer 402 of FIG. 12A. Through the modifications, the HEMT as shown in FIG. 5 or FIG. 6 may be manufactured.

Figure 14:
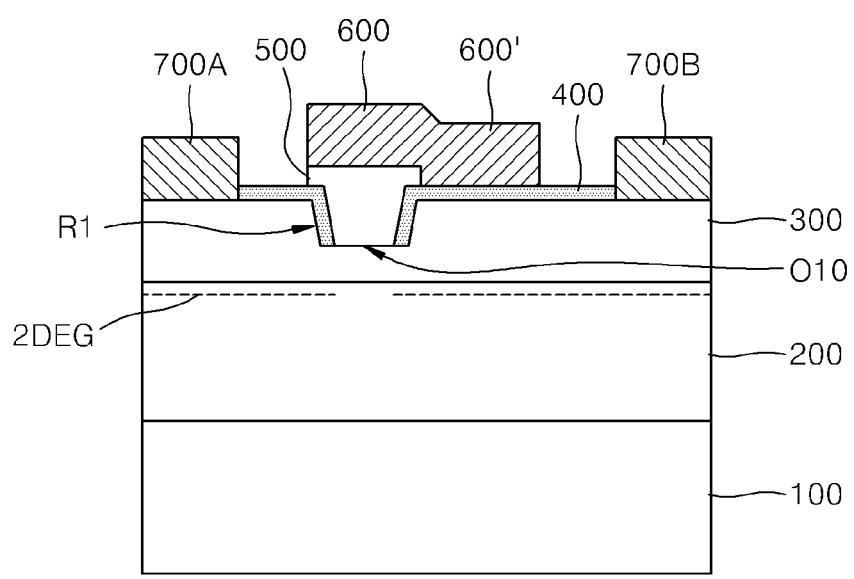
FIG. 14 is a cross-sectional view for explaining a method of manufacturing a HEMT, according to example embodiments.
Figure 15:
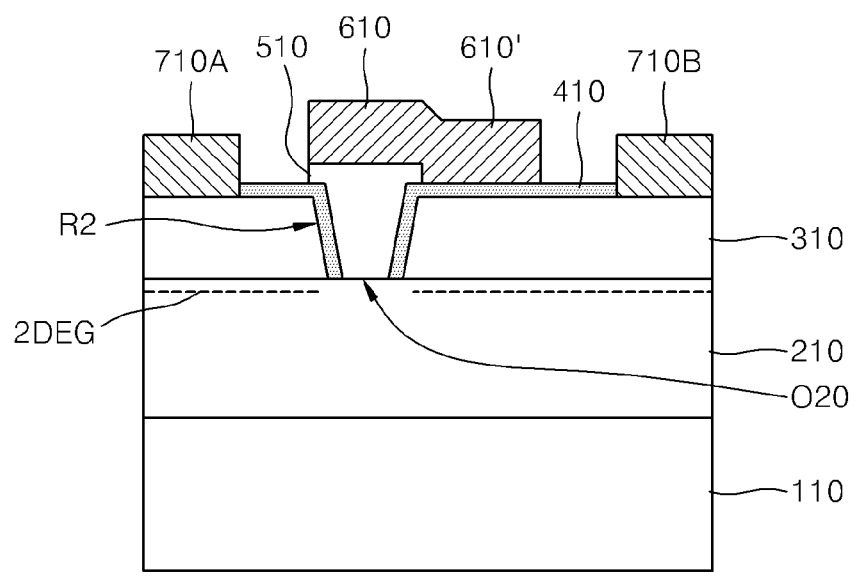
FIG. 15 is a cross-sectional view for explaining a method of manufacturing a HEMT, according to example embodiments.

In the manufacturing methods illustrated in FIGS. 10A through 10E, FIGS. 11A and 11B, FIGS. 12A and 12B, and FIGS. 13A and 13E, when forming the gate electrode 600, a field plate extending from the gate electrode 600 may be further formed, as shown in FIGS. 14 and 15.

Referring to FIGS. 14 and 15, field plates 600' and 610' extending from the gate electrodes 600 and 610 toward a side may be further formed. The field plates 600' and 610' may extend over the insulating mask layers 400 and 410 between the gate electrodes 600 and 610 and the drain electrodes 700B and 710B. When forming the field plates 600' and 610', since the insulating mask layers 400 and 410 blocks upper surfaces of the channel supply layers 300 and 310, an additional passivation process is not necessary. That is, the field plates 600' and 610' may be easily formed without performing the additional passivation process. Functions of the field plates 600' and 610' may be the same as the above descriptions with reference to FIGS. 8 and 9, and detailed descriptions thereof are not provided.

Also, in the manufacturing methods described above, the recess region R1 or R2 is formed on the channel supply layer 300 or 310, the insulating mask layer 400-402 or 410 exposing at least a portion of the recess region R1 or R2 is formed, and after that, the depletion forming layer 500-502 or 510 is formed. However, according to example embodiments, the channel supply layer 300 or 310 may be formed to be relatively thin (for example, about 15 nm or less), and then, a post-process may be performed without recessing the channel supply layer 300 or 310. In this case, the HEMT structure shown in FIG. 7 may be obtained. The above manufacturing methods may be modified variously.

Hereinafter, a method of operating a HEMT according to example embodiments will be described with reference to FIGS. 16A and 16B, and FIGS. 17A and 17B.

Figure 16A:
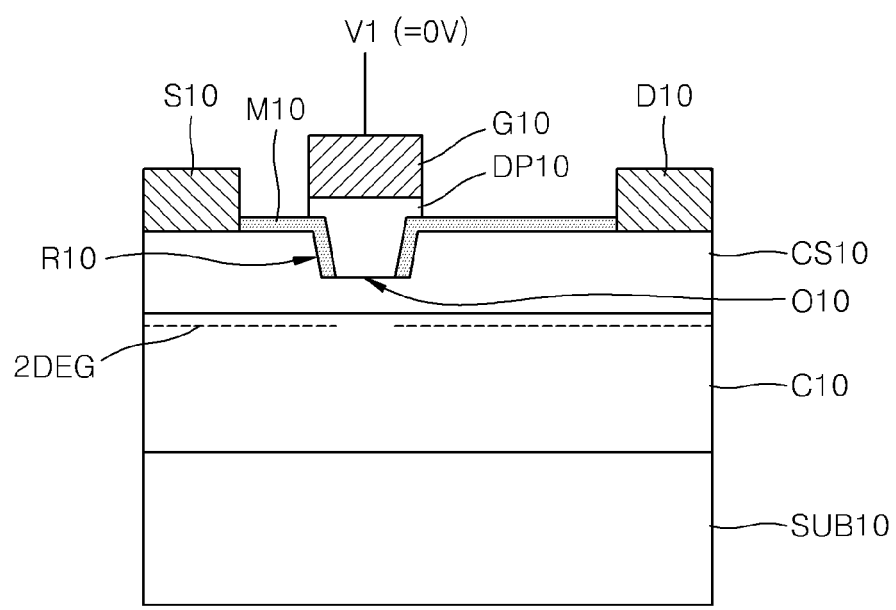
FIGS. 16A and 16B are cross-sectional views for explaining a method of operating a HEMT, according to example embodiments.
Figure 16B:
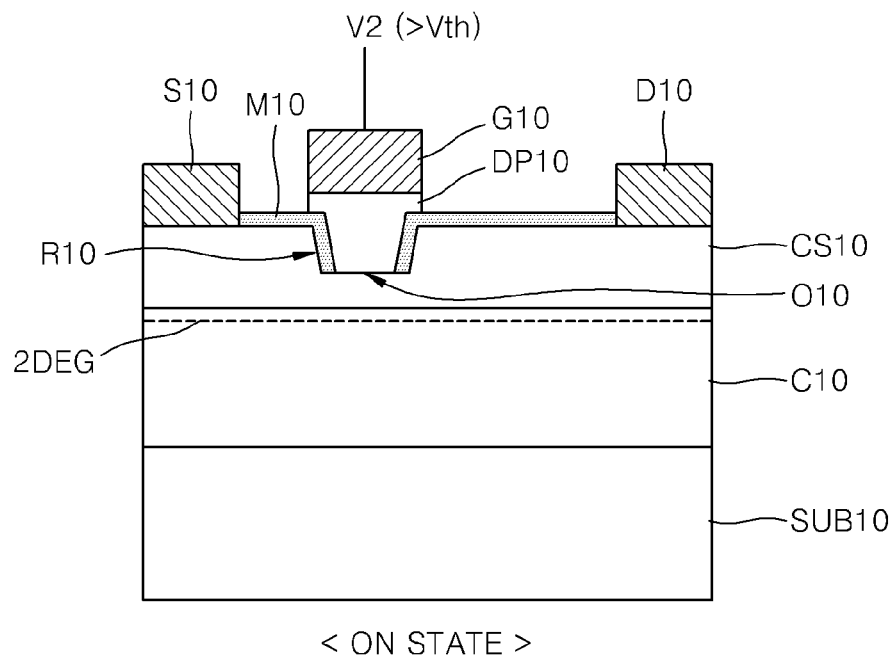

FIGS. 16A and 16B are cross-sectional views for illustrating the method of operating a HEMT according to example embodiments, for example the HEMT shown in FIG. 1.

Referring to FIG. 16A, a HEMT of turned-off (OFF) state is shown. A voltage of 0V (V1) is applied to a gate electrode G10, and a 2DEG region corresponding to the depletion forming layer DP10 is in a depleted state. The 2DEG has a disconnected region due to the depletion forming layer DP10. That is, in a state where a voltage is not applied to the gate electrode G10, an intermediate region of the 2DEG (channel), that is, a region corresponding to DP10, is disconnected. Therefore, a HEMT according to example embodiments may be in the OFF state when a gate voltage Vg is 0V. That is, a HEMT according to example embodiments be a normally-off device.

Referring to FIG. 16B, when a voltage (V2) that is greater than a threshold voltage Vth is applied to the gate electrode G10, the region of the 2DEG corresponding to the depletion forming layer DP10 may be recovered, thereby forming an entirely connected channel (e.g., 2DEG) may be formed. The recess region R10 may be formed to a depth level at which the 2DEG may be maintained in the region of the channel layer C10. In addition, the 2DEG in the region is depleted due to the depletion forming layer DP10. Thus, when the voltage V2 that is greater than the threshold voltage Vth is applied to the gate electrode G10, electric characteristics of the depletion forming layer DP10 are changed, thereby recovering the 2DEG corresponding to the depletion forming layer DP10 easily. Here, when a desired (and/or alternatively predetermined) voltage is applied between the source electrode S10 and the drain electrode D10, a desired (and/or alternatively predetermined) electric current may flow from the source electrode S10 to the drain electrode D10 through the channel (e.g., 2DEG). The channel, that is, the 2DEG, has a very high electron mobility, the HEMT may have excellent operating performance. Moreover, since the damage of the channel is reduced (and/or prevented) by the insulating mask layer M10, the channel resistance may be very low in the ON state. Therefore, the ON-resistance of the HEMT according to example embodiments may be low.

Figure 17A:
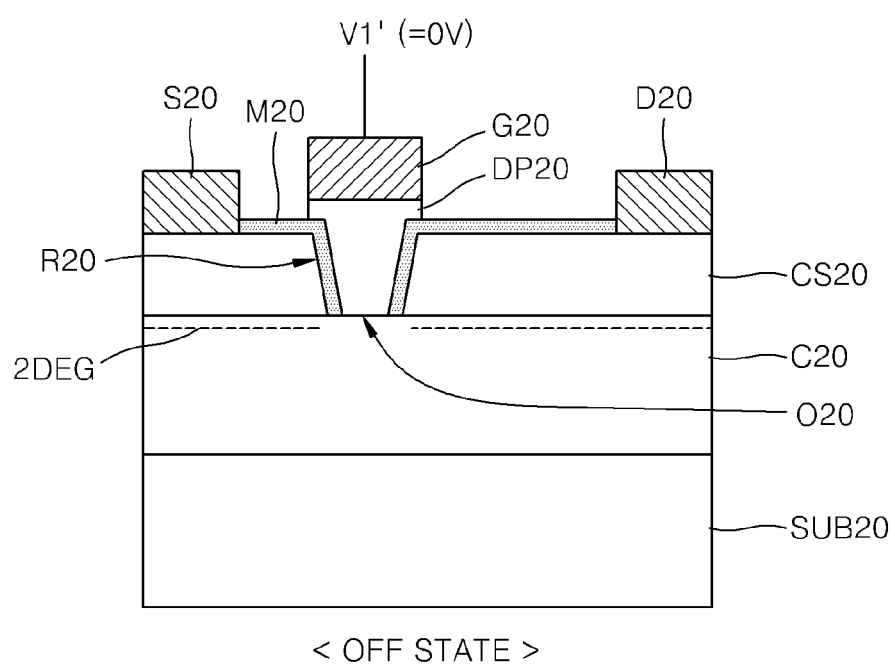
FIGS. 17A and 17B are cross-sectional views for explaining a method of operating a HEMT, according to example embodiments.
Figure 17B:
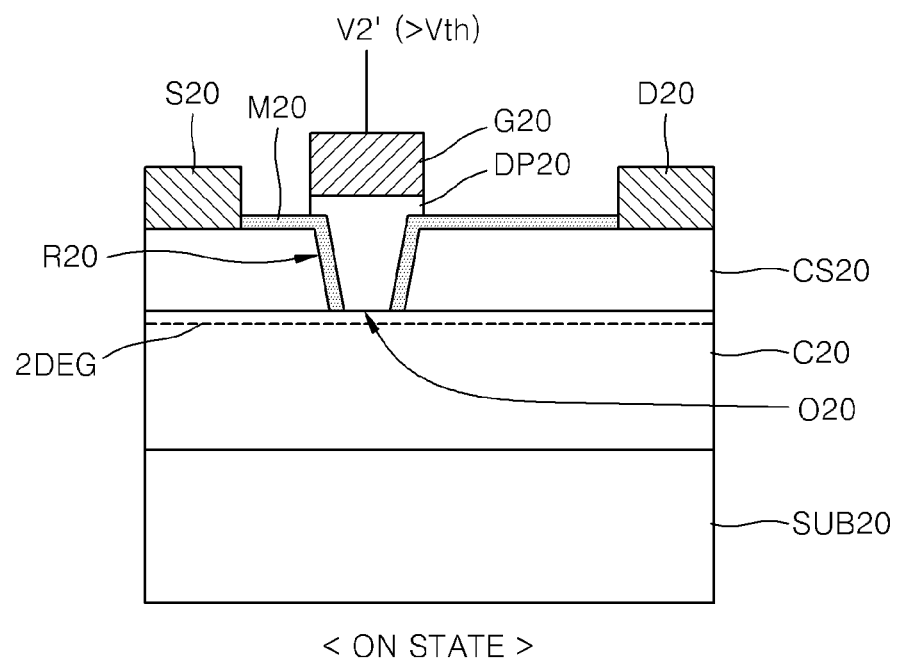

FIGS. 17A and 17B are cross-sectional views illustrating a method of operating a HEMT according to example embodiments, for example the HEMT is shown in FIG. 4A.

Referring to FIG. 17A, a HEMT at an OFF state is shown. A voltage V1' of 0V is applied to the gate electrode G20, and at this time, the 2DEG has a disconnected region corresponding to the recess region R20. Therefore, a HEMT according to example embodiments may be a normally-off device.

Referring to FIG. 17B, when a voltage V2' that is greater than the threshold voltage Vth is applied to the gate electrode G20, the disconnected 2DEG under the recess region R20 is connected, thereby forming an entirely connected channel (e.g., 2DEG). Even if there is the disconnected region in the 2DEG due to the recess region R20, when a relatively high voltage V2' is applied to the gate electrode G20, electric characteristics of the depletion forming layer DP20 are changed, thereby recovering the disconnected region of the 2DEG. To do this, the width of the recess region R20 may be narrow, respectively. In example embodiments, when the recess region R20 is formed to the interface between the channel layer C20 and the channel supply layer CS20 and the disconnected region is formed in the 2DEG due to the recess region R20, a relatively high gate voltage V2' may be necessary to turn on the HEMT. In this regard, the gate voltage V2' for turning on the HEMT of FIG. 17B may be greater than the gate voltage V2 of FIG. 16B.

The HEMT according to example embodiments may be used as, for example, a power device. However, example embodiments are not limited thereto, that is, the HEMT may be applied as various devices, as well as the power device.

FIGS. 18A to 18E are cross-sectional views for explaining a method of manufacturing a HEMT according to example embodiments. Hereinafter, the differences between FIGS. 18A to 18E and 10A to 10E will be mainly described.

Figure 18A:
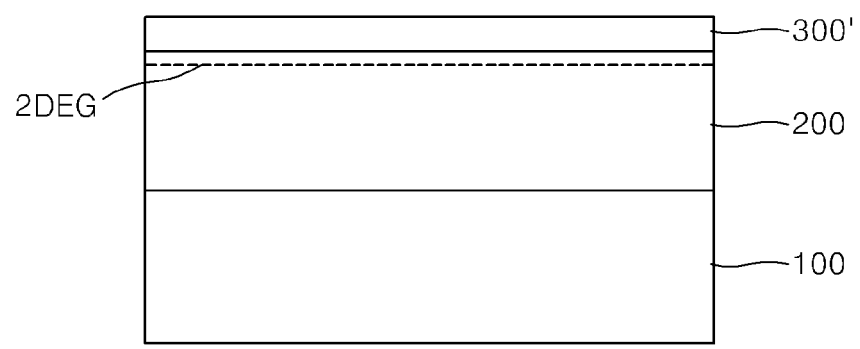
FIGS. 18A to 18E are cross-sectional views for explaining a method of manufacturing a HEMT according to example embodiments.

Referring to FIG. 18A, a channel layer 200 may be formed on a substrate 100, and a channel supply layer 300' may be formed on the channel layer 200. The channel supply layer 300' in FIG. 18A may be formed of the same materials as the channel supply layer 300 described previously with reference to FIG. 10A; however the channel supply layer 300' may have a reduced thickness compared to the channel supply layer 300.

Figure 18B:
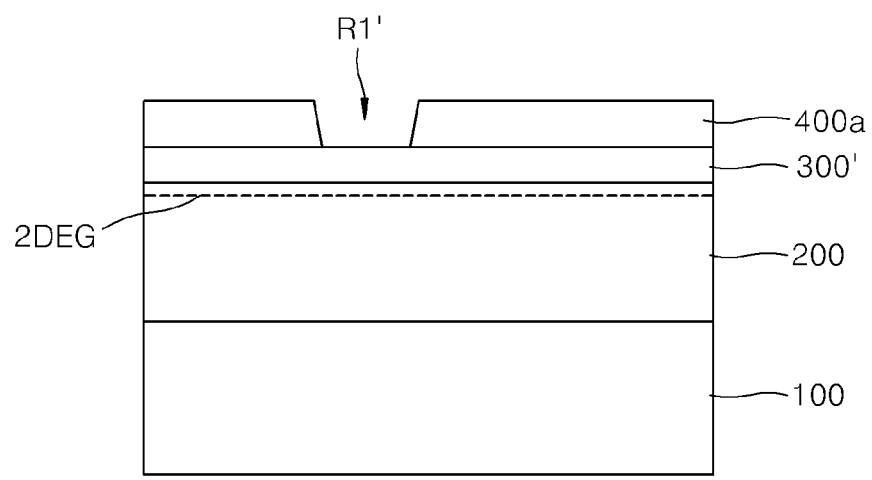

Referring to FIG. 18B, a first mask insulating layer 400a may be formed on the channel supply layer 300'. The first mask insulating layer 400a may include a dielectric material (e.g., silicon oxide or silicon nitride). The first mask insulating layer 400a may define a recess region R1' that exposes the channel supply layer 300'.

Figure 18C:
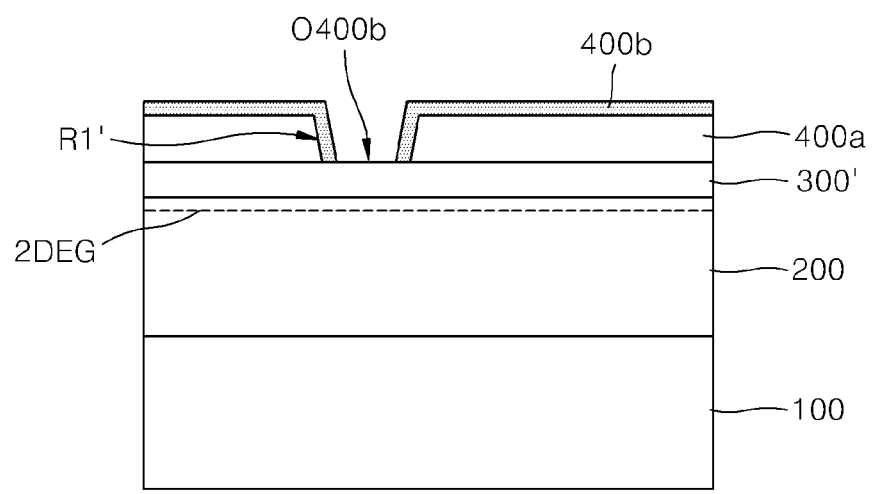

Referring to FIG. 18C, a second mask insulating layer 400b may be formed on the first mask insulating layer 400a. The second masking insulating layer 400b may define an opening O400b that exposes the channel supply layer 300'.

Figure 18D:
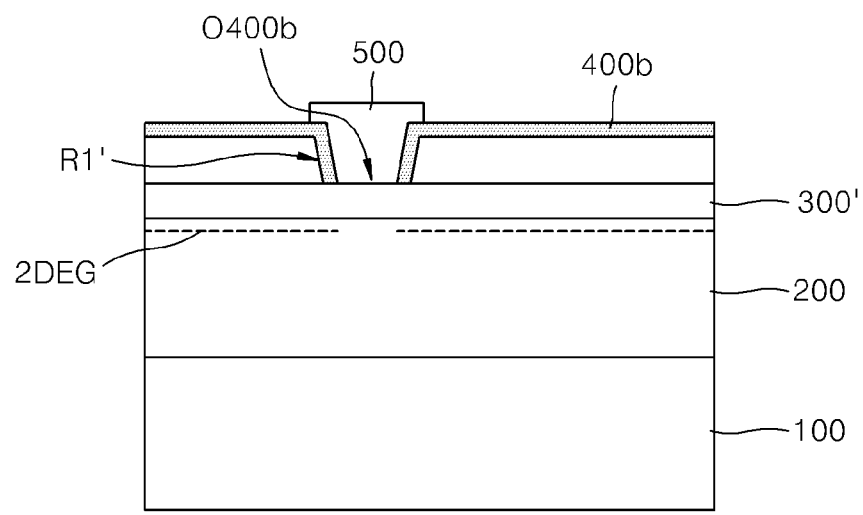

Referring to FIG. 18D, a depletion-forming layer 500 may be formed in the recess region R1' on the channel supply layer 300'.

Figure 18E:
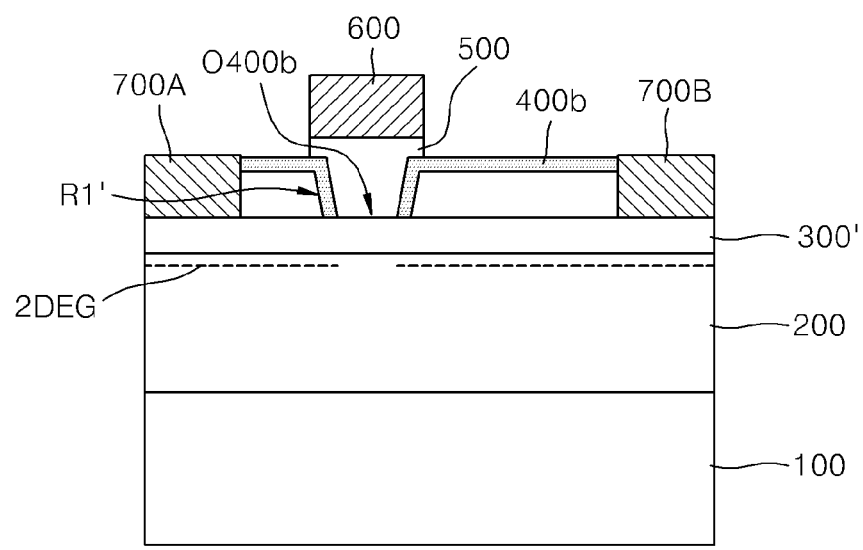

Referring to FIG. 18E, the second mask insulating layer 400b and the first mask insulating layer 400a may be patterned to expose side areas of the channel supply layer 300'. Source 700A and drain 700B electrodes may be formed at the exposed side areas of the channel supply layer 300'. A gate electrode 600 may be formed on the depletion forming layer 500. The gate electrode 600 may be directly formed on the depletion forming layer 500, but example embodiments are not limited thereto.

It should be understood that example embodiments described herein should be considered in a descriptive sense only and not for purposes of limitation. Descriptions of features or aspects within each HEMT and/or method of manufacturing a HEMT according to example embodiments should typically be considered as available for other similar features or aspects in other HEMTs and/or method of manufacturing a HEMT according to example embodiments. For example, one of ordinary skill in the art would have appreciated that the HEMT structures shown in FIGS. 1, 2A, 2B, 3, 4A, 4B, and 5 through 9 may be modified variously. In more detail, other materials, besides the GaN-based material, may be used to form the channel layer and the channel supply layer. Also, relationship between the locations of the channel layer and the channel supply layer may be exchanged. In addition, the manufacturing methods described with reference to FIGS. 10A through 15, and 18A to 18E may be modified variously. Additionally, one of ordinary skill in the art would appreciate that inventive concepts of HEMTs according to example embodiments may be applied to other semiconductor devices, as well as the HEMT.

While some example embodiments have been particularly shown and described, it will be understood by one of ordinary skill in the art that variations in form and detail may be made therein without departing from the spirit and scope of the claims.

What is claimed is:
1. A high electron mobility transistor (HEMT) comprising:
a first semiconductor layer;
a second semiconductor layer configured to induce a 2-dimensional electron gas (2DEG) in the first semiconductor layer;
an insulating mask layer on the second semiconductor layer,
the insulating mask layer defining an opening that exposes one of a portion of the first semiconductor layer and a portion of the second semiconductor layer;
a depletion forming layer on the one of the portion of the first semiconductor layer and the portion of the second semiconductor layer that is exposed by the opening in the insulating mask layer,
the depletion forming layer being configured to form a depletion region in the 2DEG, and the depletion forming layer including a group III-V based nitride semiconductor;
a gate on the depletion forming layer; and
a source and a drain on at least one of the first semiconductor layer and the second semiconductor layer,
the source and drain being spaced apart from the gate.

2. The HEMT of claim 1, wherein
a portion of the insulating mask layer is between an end of the depletion forming layer and the second semiconductor layer, and
an other portion of the insulating mask layer is between an other end of the depletion forming layer and the second semiconductor layer.

3. The HEMT of claim 1, wherein
an upper surface of the second semiconductor layer defines a recess region,
the opening in the insulating mask layer exposes one of an upper surface of the first semiconductor layer and at least a portion of the recess region, and
the depletion forming layer is in the recess region of the second semiconductor layer.

4. The HEMT of claim 3, wherein
the insulating mask layer is on the upper surface of the second semiconductor layer except for the recess region,
the opening in the insulating mask layer exposes an inner side surface of the recess region of the second semiconductor layer, and
the opening in the insulating mask layer further exposes one of the upper surface of the first semiconductor layer and a bottom surface of the recess region of the second semiconductor layer.

5. The HEMT of claim 3, wherein
the insulating mask layer is on the upper surface of the second semiconductor layer and an inner side surface of the recess region of the second semiconductor layer, and
the opening in the insulating mask layer exposes one of a bottom surface of the recess region of the second semiconductor layer and the upper surface of the first semiconductor layer.

6. The HEMT of claim 3, wherein
the insulating mask layer is on the upper surface of the second semiconductor layer,
the insulating mask layer is on an inner side surface of the recess region of the second semiconductor layer,
the insulating mask layer is on one of a portion of a bottom surface of the recess region of the second semiconductor layer and the upper surface of the first semiconductor layer, and
a remaining region of the one of the bottom surface of the recess region of the second semiconductor layer and the upper surface of the first semiconductor layer is exposed by the opening in the insulating mask layer.

7. The HEMT of claim 6, wherein the remaining region of the one of the bottom surface of the recess region of the second semiconductor layer and the upper surface of the first semiconductor layer is one of:
a center portion of the bottom surface of the recess region of the second semiconductor layer,
a portion adjacent to the center portion of the bottom surface of the recess region of the second semiconductor layer,
a center portion of the upper surface of the first semiconductor layer under the recess region of the second semiconductor layer, and
a portion adjacent to the center portion of the upper surface of the first semiconductor layer under the recess region of the second semiconductor layer.

8. The HEMT of claim 3, wherein the recess region of the second semiconductor layer is formed to a depth that is shallower than an interface between the first semiconductor layer and the second semiconductor layer.

9. The HEMT of claim 8, wherein
the recess region of the second semiconductor layer is formed to a depth level at which the 2DEG is maintained on the interface between the first semiconductor layer and the second semiconductor layer, and
a portion of the 2DEG corresponding to the recess region is depleted due to the depletion forming layer.

10. The HEMT of claim 8, wherein a thickness of the second semiconductor layer under the recess region is greater than or equal to about 5 nm.

11. The HEMT of claim 3, wherein the recess region of the second semiconductor layer is formed to an interface between the first semiconductor layer and the second semiconductor layer.

12. The HEMT of claim 11, wherein a width of a bottom surface of the recess region of the second semiconductor layer is less than or equal to about 0.5 µm.

13. The HEMT of claim 1, wherein the first semiconductor layer includes a GaN-based material.

14. The HEMT of claim 1, wherein
the second semiconductor layer is one of a single-layered structure and a multi-layered structure, and
the second semiconductor layer includes at least one nitride containing at least one of aluminum (Al), gallium (Ga), indium (In), and boron (B).

15. The HEMT of claim 1, wherein the depletion forming layer includes a p-type semiconductor.

16. The HEMT of claim 1, wherein the depletion forming layer includes a region doped with p-type impurities.

17. The HEMT of claim 1, further comprising:
a field plate extending from the gate over the insulating mask layer.

18. The HEMT of claim 17, wherein the field plate extends over the insulating mask layer between the gate and the drain.

19. The HEMT of claim 1, wherein the HEMT is configured as a normally-off device.

20. A method of manufacturing a high electron mobility transistor (HEMT), the method comprising:
forming a first semiconductor layer;
forming a second semiconductor layer that is configured to induce a 2-dimensional electron gas (2DEG) in the first semiconductor layer;
forming an insulating mask layer on the second semiconductor layer,
the insulating mask layer defining an opening that exposes one of a portion of the first semiconductor layer and a portion of the second semiconductor layer;
forming a depletion forming layer on the one of the portion of the first semiconductor layer and the portion of the second semiconductor layer that is exposed by the opening in the insulating mask layer,
the depletion forming layer being configured to form a depletion region in the 2DEG, and the depletion forming layer including a group III-V based nitride semiconductor;
forming a gate on the depletion forming layer; and
forming a source and a drain on at least one of the first semiconductor layer and the second semiconductor layer,
the source and drain being spaced apart from the gate.

21. The method of claim 20, wherein
a portion of the insulating mask layer is located between an end of the depletion forming layer and the second semiconductor layer, and
an other portion of the insulating mask layer is located between an other end of the depletion forming layer and the second semiconductor layer.

22. The method of claim 20, further comprising:
forming a recess region defined by an upper surface of the second semiconductor layer,
wherein one of an upper surface of the first semiconductor layer and at least a portion of the recess region of the second semiconductor layer is exposed by the opening in the insulating mask layer, and
the forming the depletion forming layer includes forming the depletion forming layer in the recess region of the second semiconductor layer.

23. The method of claim 22, wherein the forming the insulating mask layer includes forming the insulating mask layer on the upper surface of the second semiconductor layer except for the recess region so,
an inner side surface of the recess region of the second semiconductor layer is exposed by the opening in the insulating mask layer, and
the opening in the insulating mask layer further exposes one of the upper surface of the first semiconductor layer and a bottom surface of the recess region of the second semiconductor layer.

24. The method of claim 22, wherein the forming the insulating mask layer includes:
forming the insulating mask layer on the upper surface of the second semiconductor layer, and
forming the insulating mask layer on an inner side surface of the recess region of the second semiconductor layer so the opening in the insulating mask layer exposes one of the upper surface of the first semiconductor layer and a bottom surface of the recess region of the second semiconductor layer.

25. The method of claim 22, wherein the forming the insulating mask layer includes:
forming the insulating mask layer on the upper surface of the second semiconductor layer,
forming the insulating mask layer on an inner side surface of the second semiconductor layer in the recess region, and
forming the insulating mask layer on one of the upper surface of the first semiconductor layer and a portion of a bottom surface of the recess region of the second semiconductor layer so a remaining region of the one of the upper surface of the first semiconductor layer and the bottom surface of the recess region of the second semiconductor layer is exposed by the opening in the insulating mask layer.

26. The method of claim 25, wherein the remaining region of one of the upper surface of the first semiconductor layer and the bottom surface of the recess region of the second semiconductor layer is one of:
a center portion of the bottom surface of the recess region of the second semiconductor layer,
a portion adjacent to the center portion of the bottom surface of the recess region of the second semiconductor layer,
a center portion of the upper surface of the first semiconductor layer under the recess region of the second semiconductor layer, and
a portion adjacent to the center portion of the upper surface of the first semiconductor layer under the recess region of the second semiconductor layer.

27. The method of claim 22, wherein the forming the recess region includes forming the recess region to a depth that is shallower than an interface between the first semiconductor layer and the second semiconductor layer.

28. The method of claim 27, wherein
the forming the recess region includes forming the recess region to a depth level at which the 2DEG is maintained on the interface between the first semiconductor layer and the second semiconductor layer, and
the forming the depletion forming layer includes depleting a portion of the 2DEG corresponding to the recess region of the second semiconductor layer due to the depletion forming layer.

29. The method of claim 22, wherein the forming the recess region includes forming the recess region deep enough to expose a portion of the first semiconductor layer.

30. The method of claim 20, wherein the first semiconductor layer includes a GaN-based material.

31. The method of claim 20, wherein
the second semiconductor layer is one of a single-layered structure and a multi-layered structure, and
the second semiconductor layer includes at least one nitride containing at least one of Al, Ga, In, and B.

32. The method of claim 20, wherein the depletion forming layer includes a p-type semiconductor.

33. The method of claim 20, wherein the depletion forming layer includes a region doped with p-type impurities.

34. The method of claim 20, further comprising:
forming a field plate extending from the gate over the insulating mask layer.

35. A high electron mobility transistor (HEMT) comprising:
a first semiconductor layer;
a second semiconductor layer on the first semiconductor layer,
the second semiconductor layer being configured to induce a 2-dimensional electron gas (2DEG) in the first semiconductor layer;
a first electrode, a second electrode, and a third electrode spaced apart on at least one the first semiconductor layer and the second semiconductor layer;
a depletion forming layer configured to form a depletion region in the 2DEG,
the depletion forming layer being between the second electrode and the second semiconductor layer; and
an insulating mask layer defining an opening through which at least a portion of the depletion forming layer extends into,
the insulating mask layer covering at least one inner side surface of the second semiconductor layer in a recess region of the second semiconductor layer.

36. The high electron mobility transistor of claim 35, wherein
an upper surface of the second semiconductor layer defines the recess region,
the opening in the insulating mask layer exposes one of a portion of the first semiconductor layer and a portion of the second semiconductor layer, and
the depletion forming layer is in the recess region of the second semiconductor layer.

37. The high electron mobility transistor of claim 35, wherein
the first semiconductor layer includes a group III-V based compound semiconductor, and
the second semiconductor layer includes a group III-V based compound semiconductor that has at least one of a different polarization characteristic, a different energy bandgap, and a different lattice constant compared to the first semiconductor layer.

38. The high electron mobility transistor of claim 35, further comprising:

a field plate extending from the second electrode over the insulating mask layer, wherein the field plate is spaced apart from the first electrode and the third electrode.

\* \* \* \* \*